United States Patent
Wang et al.

(10) Patent No.: US 11,852,671 B2
(45) Date of Patent: Dec. 26, 2023

(54) PHOTOVOLTAIC ENERGY SYSTEM AND METHOD FOR DETECTING GROUND INSULATION IMPEDANCE

(71) Applicant: Huawei Digital Power Technologies Co., Ltd., Shenzhen (CN)

(72) Inventors: Zhong Wang, Shanghai (CN); Shengjie Zhang, Shanghai (CN); Jianshan Li, Shanghai (CN); Yu Peng, Shanghai (CN); Shijiang Yu, Shanghai (CN); He Zhou, Shanghai (CN); Bo Yu, Shanghai (CN)

(73) Assignee: HUAWEI DIGITAL POWER TECHNOLOGIES CO., LTD., Guangdong (CN)

( * ) Notice: Subject to any disclaimer, the term of this patent is extended or adjusted under 35 U.S.C. 154(b) by 37 days.

(21) Appl. No.: 17/707,436

(22) Filed: Mar. 29, 2022

(65) Prior Publication Data

US 2022/0326294 A1    Oct. 13, 2022

(30) Foreign Application Priority Data

Mar. 31, 2021    (CN) .......................... 202110345755.5

(51) Int. Cl.
  *G01R 31/52*    (2020.01)
  *G01R 31/14*    (2006.01)
  *H02J 3/38*     (2006.01)

(52) U.S. Cl.
  CPC ............ *G01R 31/14* (2013.01); *G01R 31/52* (2020.01); *H02J 3/381* (2013.01); *H02J 2300/24* (2020.01)

(58) Field of Classification Search
  CPC .................... G01R 31/52; G01R 31/14; H02J 2300/24–26; H02J 3/381; H02S 50/10
  See application file for complete search history.

(56) References Cited

U.S. PATENT DOCUMENTS

| 2012/0048326 A1* | 3/2012 | Matsuo ................... H02S 50/10 |
| | | 702/65 |
| 2012/0119755 A1* | 5/2012 | Ishii ....................... G01R 27/18 |
| | | 324/551 |

(Continued)

FOREIGN PATENT DOCUMENTS

| CN | 101412433 A | 4/2009 |
| CN | 103134992 A | 6/2013 |

(Continued)

*Primary Examiner* — Patrick Assouad
*Assistant Examiner* — Demetrius R Pretlow
(74) *Attorney, Agent, or Firm* — WOMBLE BOND DICKINSON (US) LLP

(57) ABSTRACT

A photovoltaic energy system and a method for detecting a ground insulation impedance, improve accuracy of detecting a ground insulation impedance after one or more conversion circuits are connected in parallel. The photovoltaic energy system includes one or more conversion circuits and a detection circuit. The detection circuit includes an alternating current signal source and a sampling resistor that are connected in series, a first sampling circuit, and a control circuit. The control circuit is configured to control the alternating current signal source to output harmonic signals of a first frequency and a second frequency. The first sampling circuit is configured to: when the alternating current signal source outputs the harmonic signal of the first frequency, collect a voltage at both terminals of the sampling resistor to obtain a first voltage.

20 Claims, 13 Drawing Sheets

(56) References Cited

U.S. PATENT DOCUMENTS

| | | | | |
|---|---|---|---|---|
| 2012/0126626 A1* | 5/2012 | Falk | ............... | H02J 1/10 307/80 |
| 2012/0163048 A1* | 6/2012 | Victor | ............... | H02H 3/16 363/55 |
| 2013/0088240 A1* | 4/2013 | Hofheinz | ............... | G01R 27/18 324/509 |
| 2013/0200713 A1* | 8/2013 | Ikawa | ............... | G01R 31/52 361/18 |
| 2013/0285670 A1* | 10/2013 | Yoshidomi | ............... | G01R 31/52 324/510 |
| 2014/0067291 A1* | 3/2014 | Balog | ............... | G01R 31/1227 702/58 |
| 2014/0176151 A1* | 6/2014 | Agamy | ............... | H02S 50/10 324/509 |
| 2014/0225444 A1* | 8/2014 | Yoshidomi | ............... | G01R 31/52 324/509 |
| 2014/0239968 A1* | 8/2014 | Ishii | ............... | H02S 50/10 324/509 |
| 2014/0247066 A1* | 9/2014 | Chaintreuil | ............... | G01R 31/129 324/761.01 |
| 2014/0253138 A1* | 9/2014 | Ishii | ............... | H02H 3/16 324/509 |
| 2017/0138991 A1* | 5/2017 | Curtis | ............... | G01R 31/52 |
| 2017/0343596 A1* | 11/2017 | Misumi | ............... | G01R 31/52 |
| 2017/0364040 A1* | 12/2017 | Ni | ............... | H02H 7/20 |
| 2018/0011149 A1* | 1/2018 | Tsai | ............... | G01R 15/146 |
| 2018/0233902 A1* | 8/2018 | Sano | ............... | H02S 50/00 |
| 2018/0302030 A1* | 10/2018 | Friebe | ............... | G01R 27/18 |
| 2019/0212381 A1* | 7/2019 | Scaletti | ............... | H02M 7/44 |
| 2021/0083468 A1* | 3/2021 | Guo | ............... | G01R 31/52 |
| 2021/0172987 A1* | 6/2021 | Wang | ............... | H02J 3/381 |
| 2022/0187347 A1* | 6/2022 | Sargsyan | ............... | G01R 15/142 |
| 2022/0252680 A1* | 8/2022 | Su | ............... | G01R 27/02 |
| 2022/0373587 A1* | 11/2022 | Fischereder | ............... | G01R 15/04 |

FOREIGN PATENT DOCUMENTS

| | | |
|---|---|---|
| CN | 106208129 A | 12/2016 |
| CN | 105548712 B | 7/2018 |
| CN | 106452358 B | 7/2018 |
| CN | 108427038 A | 8/2018 |
| CN | 108896822 A | 11/2018 |
| CN | 109725202 A | 5/2019 |
| CN | 109188230 B | 9/2020 |
| CN | 111679210 A | 9/2020 |
| EP | 3617725 A1 | 3/2020 |

\* cited by examiner

PHOTOVOLTAIC ENERGY SYSTEM AND METHOD FOR DETECTING GROUND INSULATION IMPEDANCE

CROSS-REFERENCE TO RELATED APPLICATIONS

This application claims priority to Chinese Patent Application No. 202110345755.5, filed on Mar. 31, 2021, which is hereby incorporated by reference in its entirety.

TECHNICAL FIELD

This application relates to the field of energy technologies, and in particular, to a photovoltaic energy system and a method for detecting a ground insulation impedance.

BACKGROUND

With the rapid development of new energy technologies, photovoltaic energy systems have been increasingly widely applied. The photovoltaic energy system may also be referred to as a solar photovoltaic (PV) energy storage and power generation system, and may be formed by connecting a photovoltaic power generation circuit, an energy storage circuit, and an inverter circuit in parallel. The photovoltaic power generation circuit can convert clean and pollution-free solar energy into electric energy; and the electric energy not only can be supplied to residential devices after passing through the inverter circuit, to satisfy daily power supply requirements of residents, but also can be transferred to the energy storage circuit for storage, thereby effectively improving reliability of residential electricity utilization. Each type of circuit included in the photovoltaic energy system usually includes a converter. For example, the photovoltaic power generation circuit usually includes a maximum power point tracking (MPPT) converter, the energy storage circuit usually includes a direct current-direct current (DC-DC) converter, and the inverter circuit usually includes an inverter. Therefore, the photovoltaic power generation circuit, the energy storage circuit, and the inverter circuit each is a conversion circuit.

However, because each type of conversion circuit in the photovoltaic energy system may have a quite high voltage class, insulation performance of the conversion circuit directly affects safe operation of the system. To ensure safety of an operator, normal working of an electrical device, and the safe operation of the system, quickly and accurately detecting an insulation status of the photovoltaic energy system relative to the ground and performing fault handling in time are a basic condition for the safe operation of the photovoltaic energy system.

Therefore, how to accurately detect a ground insulation impedance obtained after one or more conversion circuits are connected in parallel is an issue worth studying and solving.

SUMMARY

This application provides a photovoltaic energy system and a method for detecting a ground insulation impedance, to improve accuracy of detecting a ground insulation impedance, without increasing system costs.

According to a first aspect, an embodiment of this application provides a photovoltaic energy system, including one or more conversion circuits and a detection circuit, where the one or more conversion circuits are connected in parallel between a positive bus and a negative bus; the detection circuit includes a signal source excitation branch, a first sampling circuit, and a control circuit; one terminal of the signal source excitation branch is connected to a ground wire, and the other terminal of the signal source excitation branch is connected to the positive bus or the negative bus; the signal source excitation branch includes an alternating current signal source and a sampling resistor that are connected in series; the first sampling circuit is connected in parallel to the sampling resistor, and the control circuit is connected to both an input terminal of the alternating current signal source and an output terminal of the first sampling circuit; the control circuit is configured to control the alternating current signal source to output harmonic signals of a first frequency and a second frequency, where the first frequency is different from the second frequency; the first sampling circuit is configured to: when the alternating current signal source outputs the harmonic signal of the first frequency, collect a voltage at both terminals of the sampling resistor to obtain a first voltage; when the alternating current signal source outputs the harmonic signal of the second frequency, collect a voltage at both terminals of the sampling resistor to obtain a second voltage; and send the first voltage and the second voltage to the control circuit; and the control circuit is further configured to detect, based on the harmonic signals of the first frequency and the second frequency, the first voltage, and the second voltage, a ground insulation impedance obtained after the one or more conversion circuits are connected in parallel.

In the foregoing solution, in this application, the detection circuit and the one or more conversion circuits are connected in parallel on the bus, and a harmonic injection method is used. In this way, impact of a parasitic capacitance existing in the one or more conversion circuits due to wiring can be considered, and the ground insulation impedance detected according to this application does not include a parasitic capacitance. In a solution used in a conventional technology, a detected ground insulation impedance includes a parasitic capacitance because impact of a parasitic capacitance is not considered, leading to a disadvantage of low detection accuracy. Compared with the solution used in the conventional technology, the photovoltaic energy system provided in this application can improve accuracy of detecting the ground insulation impedance, to improve accuracy of detecting an insulation status, thereby ensuring safety of the photovoltaic energy system.

In one embodiment, the detection circuit may further include a direct current blocking capacitor, the other terminal of the signal source excitation branch is connected to the positive bus or the negative bus through the direct current blocking capacitor, and the direct current blocking capacitor is configured to isolate a direct current signal in the one or more conversion circuits for the detection circuit. In one embodiment, the direct current blocking capacitor can block a direct current high voltage signal in the one or more conversion circuits for the detection circuit. In this way, impact of the direct current signal in the detection circuit can be eliminated, thereby improving the accuracy of detecting the ground insulation impedance.

In one embodiment, the first sampling circuit is further configured to: collect a first phase corresponding to the first voltage when the first voltage is collected, collect a second phase corresponding to the second voltage when the second voltage is collected, and send the first phase and the second phase to the control circuit; and the control circuit is configured to detect, based on the harmonic signals of the first frequency and the second frequency, the first voltage, the second voltage, the first phase, and the second phase, the ground insulation impedance obtained after the one or more conversion circuits are connected in parallel. In one embodiment, on a basis that the detection circuit includes the direct current blocking capacitor, to avoid impact of the direct current blocking capacitor on detection of the ground insulation impedance obtained after the one or more conversion circuits are connected in parallel, the phases of the voltage signals collected from the sampling resistor after harmonic injection may be further used to calculate the ground insulation impedance, to improve accuracy of detecting the insulation status.

After the control circuit detects the ground insulation impedance obtained after the one or more conversion circuits are connected in parallel, the following several scenarios may be included:

Scenario 1: The control circuit is further configured to: when the ground insulation impedance is greater than or equal to a first impedance threshold, detect that an insulation status of the one or more conversion circuits is normal. In one embodiment, it can be understood that, if the ground insulation impedance obtained after the one or more conversion circuits are connected in parallel is large enough, it indicates that an insulation status of the photovoltaic energy system is normal, in other words, no ground insulation impedance fault occurs.

Scenario 2: The detection circuit further includes one or more leakage current sampling circuit one-to-one connected to the one or more conversion circuits; an input terminal of each leakage current sampling circuit is connected to both an input terminal and an output terminal of a conversion circuit connected to the leakage current sampling circuit, and an output terminal of each leakage current sampling circuit is connected to the control circuit; each leakage current sampling circuit is configured to: sample a first leakage current between the connected conversion circuit and the positive bus and a second leakage current between the connected conversion circuit and the negative bus to obtain a total leakage current of the connected conversion circuit; and send the total leakage current to the control circuit; and the control circuit is further configured to: when the ground insulation impedance is less than a second impedance threshold, detect that an insulation status of a conversion circuit corresponding to a total leakage current whose value is the largest in the total leakage currents sent by all the leakage current sampling circuits is abnormal, where the second impedance threshold is half of the first impedance threshold.

In one embodiment, it can be understood that, if the ground insulation impedance obtained after the one or more conversion circuits are connected in parallel is relatively small, it indicates that the insulation status of the photovoltaic energy system is abnormal, in other words, a ground insulation impedance fault occurs. Further, each conversion circuit may be detected based on a value of a total leakage current of the conversion circuit. For a conversion circuit, a larger value of a leakage current indicates a smaller ground insulation impedance. In this way, a faulty circuit in the conversion circuits can be detected.

Scenario 3: The detection circuit further includes a second sampling circuit and a third sampling circuit; one terminal of the second sampling circuit is connected to the positive bus and the other terminal of the second sampling circuit is connected to the ground wire, and the second sampling circuit is connected to the control circuit and is configured to: sample a voltage between the positive bus and the ground wire to obtain a first bus voltage, and send the first bus voltage to the control circuit; one terminal of the third sampling circuit is connected to the negative bus and the other terminal of the third sampling circuit is connected to the ground wire, and the third sampling circuit is connected to the control circuit and is configured to: sample a voltage between the negative bus and the ground wire to obtain a second bus voltage, and send the second bus voltage to the control circuit; and the control circuit is further configured to: when the ground insulation impedance is less than the first impedance threshold and greater than or equal to the second impedance threshold, detect, based on the first leakage current and the second leakage current of each conversion circuit, the first bus voltage, the second bus voltage, and the ground insulation impedance, a positive ground insulation impedance obtained after the one or more conversion circuits are connected in parallel between the positive bus and the ground wire and a negative ground insulation impedance obtained after the one or more conversion circuits are connected in parallel between the negative bus and the ground wire; when the positive ground insulation impedance is greater than or equal to the first impedance threshold, detect that an insulation status of the one or more conversion circuits between the positive bus and the ground wire is normal, otherwise, detect that an insulation status of the one or more conversion circuits between the positive bus and the ground wire is abnormal; and when the negative ground insulation impedance is greater than or equal to the first impedance threshold, detect that an insulation status of the one or more conversion circuits between the negative bus and the ground wire is normal, otherwise, detect that an insulation status of the one or more conversion circuits between the negative bus and the ground wire is abnormal.

In one embodiment, it can be understood that, if whether the one or more conversion circuits are abnormal cannot be detected based on the ground insulation impedance obtained after the one or more conversion circuits are connected in parallel, both the positive ground insulation impedance and the negative ground insulation impedance may be first calculated to detect whether an abnormality exists in the one or more conversion circuits. Because a parallel impedance (a ground insulation impedance obtained after a parallel connection) is smaller than any partial impedance, if all partial impedances (namely, the positive ground insulation impedance and the negative ground insulation impedance described in the foregoing embodiment) are normal, it may also be detected that an insulation status of the one or more conversion circuits is normal.

In the embodiment described above in which the leakage current sampling circuit is used to collect the first leakage current and the second leakage current of the connected conversion circuit to obtain the total leakage current, because there is the alternating current signal source in the detection circuit, the total leakage current collected by the leakage current sampling circuit not only includes a direct current signal but also includes an alternating current signal. To further improve detection accuracy of the control circuit, before detecting the ground insulation impedance based on the total leakage current, the control circuit may further filter the total leakage current collected by the leakage current sampling circuit. There may be at least the following two filtering manners:

Filtering manner 1: The detection circuit further includes an alternating current signal filter one-to-one connected to each leakage current sampling circuit; an input terminal of each alternating current signal filter is connected to a leakage current sampling circuit corresponding to the alternating current signal filter, and an output terminal of each alternating current signal filter is connected to the control circuit; and the alternating current signal filter is configured to filter out an alternating current signal included in a total leakage current of the conversion circuit sampled by the leakage current sampling circuit. In one embodiment, to improve the accuracy of detecting the ground insulation impedance, before performing processing based on a leakage current, the control circuit may further filter out an alternating current signal included in the leakage current in an analog filtering manner, thereby ensuring accuracy of calculating the positive ground insulation impedance and the negative ground insulation impedance.

Filtering manner 2: The control circuit is further configured to: receive a total leakage current that is sampled by a target leakage current sampling circuit and that is of a conversion circuit connected to the target leakage current sampling circuit, where the target leakage current sampling circuit is any one of all the leakage current sampling circuits; and after performing analog-to-digital conversion on the total leakage current of the conversion circuit connected to the target leakage current sampling circuit, filter out an alternating current signal included in a total leakage current obtained after the analog-to-digital conversion. In one embodiment, to improve the accuracy of detecting the ground insulation impedance, before performing processing based on a leakage current, the control circuit may further filter out an alternating current signal included in the leakage current in a digital filtering manner, thereby ensuring accuracy of calculating the positive ground insulation impedance and the negative ground insulation impedance.

In one embodiment, the ground insulation impedance satisfies the following formulas:

$$|\dot{v}_{r1}| = |\frac{R_r}{R_r + \frac{1}{j\omega_1 C_x} // R_x} \dot{V}_{s1}|$$

$$|\dot{v}_{r2}| = |\frac{R_r}{R_r + \frac{1}{j\omega_2 C_x} // R_x} \dot{V}_{s2}|$$

where $|\dot{v}_{r1}|$ represents the first voltage, and $|\dot{v}_{r2}|$ represents the second voltage; $\omega_1$ represents the harmonic signal of the first frequency, and $\omega_2$ represents the harmonic signal of the second frequency; $R_r$ represents an impedance of the sampling resistor, $R_x$ represents the ground insulation impedance, and $C_x$ represents a capacitance value of a parasitic capacitor in the photovoltaic energy system; and $|\dot{V}_{s1}|$ represents a maximum voltage of the harmonic signal of the first frequency, and $|\dot{V}_{s2}|$ represents a maximum voltage of the harmonic signal of the second frequency.

In one embodiment, according to the foregoing two formulas, because known quantities in the formulas are $R_x$ and $C_x$, a value of the ground insulation impedance can be calculated. In addition, because the parasitic capacitance $C_x$ is not used as a known quantity during calculation of $R_x$ in this application, the accuracy of detecting the ground insulation impedance can be improved, thereby ensuring safety of the photovoltaic energy system.

In one embodiment, the ground insulation impedance satisfies the following formulas:

$$|\dot{v}_{r1}| = |\frac{R_r}{R_r + \frac{1}{j\omega_1 C_r} + \frac{1}{j\omega_1 C_x} // R_x} \dot{V}_{s1}|$$

$$|\dot{v}_{r2}| = |\frac{R_r}{R_r + \frac{1}{j\omega_2 C_r} + \frac{1}{j\omega_2 C_x} // R_x} \dot{V}_{s2}|$$

$$\varphi_1 = -\arctan\frac{1 - \omega_1^2 C_x^2 R_x^2 + \omega_1^2 C_r C_x R_x^2}{\omega_1 R_r C_r(1 - \omega_1^2 C_x^2 R_x^2) + \omega_1 R_x C_r}$$

$$\varphi_2 = -\arctan\frac{1 - \omega_2^2 C_x^2 R_x^2 + \omega_2^2 C_r C_x R_x^2}{\omega_2 R_r C_r(1 - \omega_2^2 C_x^2 R_x^2) + \omega_2 R_x C_r}$$

where $|\dot{v}_{r1}|$ represents the first voltage, and $|\dot{v}_{r2}|$ represents the second voltage; $\omega_1$ represents the harmonic signal of the first frequency, and $\omega_2$ represents the harmonic signal of the second frequency; $R_r$ represents an impedance of the sampling resistor, and $C_r$ represents a capacitance value of the direct current blocking capacitor; $R_x$ represents the ground insulation impedance, and $C_x$ represents a capacitance value of a parasitic capacitor in the photovoltaic energy system; $|\dot{V}_{s1}|$ represents a maximum voltage of the harmonic signal of the first frequency, and $|\dot{V}_{s2}|$ represents a maximum voltage of the harmonic signal of the second frequency; and $\varphi_1$ represents the first phase, and $\varphi_2$ represents the second phase.

In one embodiment, according to any three of the foregoing formulas, because known quantities in the formulas are $C_r$, $R_x$, and $C_x$, a value of the ground insulation impedance can be calculated. In addition, because $C_r$ and the parasitic capacitance $C_x$ are not used as known quantities during calculation of $R_x$ in this application, the accuracy of detecting the ground insulation impedance can be improved, thereby ensuring safety of the photovoltaic energy system.

In one embodiment, the ground insulation impedance satisfies the following formula:

$$R_x = \frac{R_r(|\dot{V}_{s1}|\cos\varphi_1 - |\dot{v}_{r1}|)}{|\dot{v}_{r1}|\cos^2(\arctan(\omega_1 C_x R_x))} \text{ or } R_x = \frac{R_r(|\dot{V}_{s2}|\cos\varphi_2 - |\dot{v}_{r2}|)}{|\dot{v}_{r2}|\cos^2(\arctan(\omega_2 C_x R_x))}$$

$C_x R_x$ satisfies the following formula:

$$C_x R_x = \frac{\omega_2|\dot{v}_{r1}||\dot{V}_{s2}|\sin\varphi_2 - \omega_1|\dot{v}_{r2}||\dot{V}_{s1}|\sin\varphi_1}{\omega_1^2|\dot{v}_{r2}||\dot{V}_{s1}|\cos\varphi_1 - \omega_1^2|\dot{v}_{r2}||\dot{v}_{r1}| - \omega_2^2|\dot{v}_{r1}||\dot{V}_{s2}|\cos\varphi_2 + \omega_2^2|\dot{v}_{r1}||\dot{v}_{r2}|}$$

where $|\dot{v}_{r1}|$ represents the first voltage, and $|\dot{v}_{r2}|$ represents the second voltage; $\omega_1$ represents the harmonic signal of the first frequency, and $\omega_2$ represents the harmonic signal of the second frequency; $R_r$ represents an impedance of the sampling resistor; $R_x$ represents the ground insulation impedance, and $C_x$ represents a capacitance value of a parasitic capacitor in the photovoltaic energy system; $|\dot{V}_{s1}|$ represents a maximum voltage of the harmonic signal of the first frequency, and $|\dot{V}_{s2}|$ represents a maximum voltage of the harmonic signal of the second frequency; and $\varphi_1$ represents the first phase, and $\varphi_2$ represents the second phase.

In one embodiment, according to the foregoing formula for calculating the ground insulation impedance $R_x$, it can be learned that $C_r$ and the parasitic capacitance $C_x$ are not used as known quantities during calculation of $R_x$ in this application. Therefore, the accuracy of detecting the ground insulation impedance can be improved, thereby ensuring safety of the photovoltaic energy system.

According to a second aspect, an embodiment of this application further provides a method for detecting a ground insulation impedance. The method is applied to the photovoltaic energy system described in the first aspect. The method includes: The control circuit controls the alternating current signal source to output harmonic signals of a first frequency and a second frequency, where the first frequency is different from the second frequency; the control circuit receives a first voltage and a second voltage that are sent by the first sampling circuit, where the first voltage is obtained by the first sampling circuit by collecting a voltage at both terminals of the sampling resistor when the alternating current signal source outputs the harmonic signal of the first frequency, and the second voltage is obtained by the first sampling circuit by collecting a voltage at both terminals of the sampling resistor when the alternating current signal source outputs the harmonic signal of the second frequency; and the control circuit detects, based on the harmonic signals of the first frequency and the second frequency, the first voltage, and the second voltage, a ground insulation impedance obtained after the one or more conversion circuits are connected in parallel.

In one embodiment, the method further includes: The control circuit receives a first phase and a second phase that are sent by the first sampling circuit, where the first phase corresponds to the first voltage and is collected by the first sampling circuit when the first sampling circuit collects the first voltage, and the second phase corresponds to the second voltage and is collected by the first sampling circuit when the first sampling circuit collects the second voltage. That the control circuit detects, based on the harmonic signals of the first frequency and the second frequency, the first voltage, and the second voltage, a ground insulation impedance obtained after the one or more conversion circuits are connected in parallel may be implemented as follows: The control circuit detects, based on the harmonic signals of the first frequency and the second frequency, the first voltage, the second voltage, the first phase, and the second phase, the ground insulation impedance obtained after the one or more conversion circuits are connected in parallel.

After the control circuit detects the ground insulation impedance obtained after the one or more conversion circuits are connected in parallel, the method may further include the following several scenarios:

Scenario 1: When the ground insulation impedance is greater than or equal to a first impedance threshold, the control circuit detects that an insulation status of the one or more conversion circuits is normal.

Scenario 2: The detection circuit further includes a leakage current sampling circuit one-to-one connected to the one or more conversion circuits; and an input terminal of each leakage current sampling circuit is connected to both an input terminal and an output terminal of a conversion circuit connected to the leakage current sampling circuit, and an output terminal of each leakage current sampling circuit is connected to the control circuit. The method further includes: The control circuit receives a total leakage current of the connected conversion circuit sent by each leakage current sampling circuit, where the total leakage current of the conversion circuit is obtained by each leakage current sampling circuit by sampling a first leakage current between the connected conversion circuit and the positive bus and a second leakage current between the connected conversion circuit and the negative bus; and when the ground insulation impedance is less than a second impedance threshold, the control circuit detects that an insulation status of a conversion circuit corresponding to a leakage current whose value is the largest in the leakage currents sent by all the leakage current sampling circuits is abnormal, where the second impedance threshold is half of the first impedance threshold.

Scenario 3: The detection circuit further includes a second sampling circuit and a third sampling circuit; one terminal of the second sampling circuit is connected to the positive bus and the other terminal of the second sampling circuit is connected to the ground wire, and the second sampling circuit is connected to the control circuit and is configured to: sample a voltage between the positive bus and the ground wire to obtain a first bus voltage, and send the first bus voltage to the control circuit; and one terminal of the third sampling circuit is connected to the negative bus and the other terminal of the third sampling circuit is connected to the ground wire, and the third sampling circuit is connected to the control circuit and is configured to: sample a voltage between the negative bus and the ground wire to obtain a second bus voltage, and send the second bus voltage to the control circuit. The method further includes: When the ground insulation impedance is less than the first impedance threshold and greater than or equal to the second impedance threshold, the control circuit detects, based on the first leakage current and the second leakage current of each conversion circuit, the first bus voltage, the second bus voltage, and/or the ground insulation impedance, a positive ground insulation impedance obtained after the one or more conversion circuits are connected in parallel between the positive bus and the ground wire and a negative ground insulation impedance obtained after the one or more conversion circuits are connected in parallel between the negative bus and the ground wire; when the positive ground insulation impedance is greater than or equal to the first impedance threshold, the control circuit detects that an insulation status of the one or more conversion circuits between the positive bus and the ground wire is normal, otherwise, detects that an insulation status of the one or more conversion circuits between the positive bus and the ground wire is abnormal; and when the negative ground insulation impedance is greater than or equal to the first impedance threshold, the control circuit detects that an insulation status of the one or more conversion circuits between the negative bus and the ground wire is normal, otherwise, detects that an insulation status of the one or more conversion circuits between the negative bus and the ground wire is abnormal.

According to a third aspect, this application provides a chip. The chip may be a chip in an inverter, and the chip is configured to perform the method according to any embodiment in the second aspect.

For details of beneficial effects of the second aspect and the third aspect, refer to the beneficial effects corresponding to the embodiments in the first aspect. Details are not described herein again.

BRIEF DESCRIPTION OF DRAWINGS

FIG. 6a-1 and FIG. 6a-2 are a schematic diagram 4 of a structure of a photovoltaic energy system according to an embodiment of this application.

DESCRIPTION OF EMBODIMENTS

The following further describes in detail this application with reference to the accompanying drawings.

With the rapid development of new energy technologies, photovoltaic energy systems have been increasingly widely applied. The photovoltaic energy system may also be referred to as a solar photovoltaic energy storage and power generation system, and may be formed by connecting a photovoltaic power generation circuit, an energy storage circuit, and an inverter circuit in parallel. The photovoltaic power generation circuit can convert clean and pollution-free solar energy into electric energy; and the electric energy not only can be supplied to residential devices after passing through the inverter circuit, to satisfy daily power supply requirements of residents, but also can be transferred to the energy storage circuit for storage, thereby effectively improving reliability of residential electricity utilization.

Figure 1A:
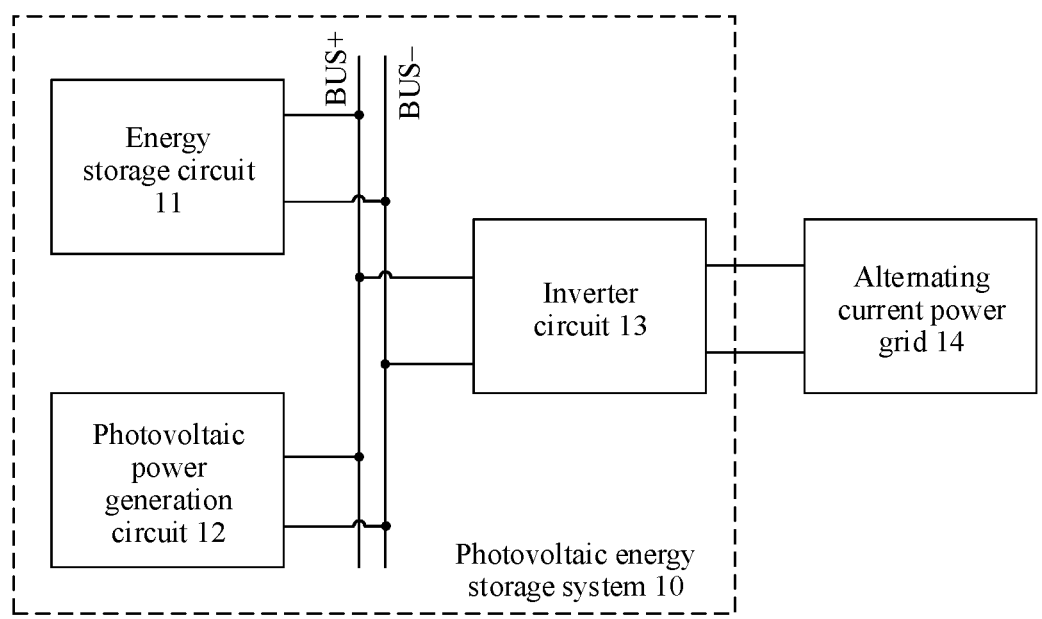
FIG. 1a is a schematic diagram of a structure of a photovoltaic energy system.

As shown in FIG. 1a, a photovoltaic energy system 10 may include an energy storage circuit 11, a photovoltaic power generation circuit 12, and an inverter circuit 13. The energy storage circuit 11, the photovoltaic power generation circuit 12, and the inverter circuit 13 may be connected in parallel on a positive bus (BUS+) and a negative bus (BUS−).

The photovoltaic power generation circuit 12 may usually include a photovoltaic module (for example, a photovoltaic panel). Therefore, the photovoltaic power generation circuit 12 may perform power generation by using optical energy (solar energy), that is, convert the absorbed optical energy (solar energy) into photovoltaic electric energy by using the photovoltaic panel. The "photovoltaic power generation circuit" may also be referred to as a "photovoltaic system" or the like. If an output power of the photovoltaic power generation circuit 12 is relatively high, one part of the photovoltaic electric energy output by the photovoltaic power generation circuit 12 may be output to an alternating current power grid 14 after passing through the inverter circuit 13, to be supplied to residential devices to satisfy daily power supply requirements of residents. The other part of the photovoltaic electric energy may be transferred to the energy storage circuit 11 for storage.

The energy storage circuit 11 may usually include an energy storage component, or referred to as an energy storage battery cluster or the like, and may perform charging and discharging by using the energy storage component, to improve reliability of power supply in the photovoltaic energy system 10. The "energy storage circuit" may also be referred to as an "energy system" or the like. When the output power of the photovoltaic power generation circuit 12 is relatively high, the energy storage circuit 11 may store the photovoltaic electric energy in the photovoltaic power generation circuit 12 other than the photovoltaic electric energy output to the alternating current power grid 14, that is, perform "charging" or "electric storage". In addition, when the output power of the photovoltaic power generation circuit 12 is relatively low, the energy storage circuit 11 may output the stored electric energy, so that the stored electric energy is output to the alternating current power grid 14 after passing through the inverter circuit 13.

The inverter circuit 13 may perform direct current-alternating current conversion on direct current electric energy received from the photovoltaic power generation circuit 12 and/or the energy storage circuit 11, and output obtained alternating current electric energy to the alternating current power grid 14. Alternatively, the inverter circuit 13 may perform alternating current-direct current conversion on alternating current electric energy received from the alternating current power grid 14, and output obtained direct current electric energy to the energy storage circuit 11 for storage. The "inverter circuit" may also be referred to as an "inverter", a "photovoltaic inverter", a "bidirectional inverter (power conversion system, PCS)", or the like. In addition, the inverter circuit 13 may serve as a charging/discharging control apparatus of the energy storage circuit 11, and control, according to a power requirement of the alternating current power grid 14, the energy storage circuit 11 to perform charging or discharging. This improves reliability and effectiveness of power supply in the photovoltaic energy system.

It can be understood that, in daytime, especially on a sunny day or in another scenario in which optical energy is relatively strong, the photovoltaic power generation circuit 12 has an output power. In this case, it is considered that the photovoltaic power generation circuit 12 may supply power to the alternating current power grid 14 by using the inverter circuit 13. In a scenario in which optical energy is stronger, an output power of the photovoltaic power generation circuit 12 is higher. When the output power is higher than a target power required by the alternating current power grid 14, it may be considered that only the photovoltaic power generation circuit 12 supplies power to the alternating current power grid 14 by using the inverter circuit 13. In addition, partial electric energy corresponding to a power obtained by subtracting the target power from the output power of the photovoltaic power generation circuit 12 may be stored in the energy storage circuit 11. In a scenario in which optical energy is relatively weak, an output power of the photovoltaic power generation circuit 12 is relatively low. When the output power cannot reach the target power required by the alternating current power grid 14, the photovoltaic power generation circuit 12 and the energy storage circuit 11 jointly supply power to the alternating current power grid 14 by using the inverter circuit 13. In a scenario such as on a cloudy day or at night, an output power of the photovoltaic power generation circuit 12 may approach 0 W. In this case, it may be considered that only the energy storage circuit 11 supplies power to the alternating current power grid 14 by using the inverter circuit 13. In other words, direct current electric energy received by the inverter circuit 13 may be only from the photovoltaic power generation circuit 12, may be only from the energy storage circuit 11, or may be hybrid electric energy including battery electric energy output by the energy storage circuit 11 and photovoltaic electric energy output by the photovoltaic power generation circuit 12.

For example, the target power required by the alternating current power grid 14 is 60 W. When a power corresponding to photovoltaic electric energy output by the photovoltaic power generation circuit 12 is 80 W, the inverter circuit 13 may provide photovoltaic electric energy of 60 W in the output photovoltaic electric energy to the alternating current power grid 14, and the remaining photovoltaic electric energy of 20 W may be stored in the energy storage circuit 11 as charging electric energy. When a power corresponding to photovoltaic electric energy output by the photovoltaic power generation circuit 12 is 30 W, the inverter circuit 13 may control the energy storage circuit 11 to provide the remaining direct current electric energy of 30 W. When a power corresponding to photovoltaic electric energy output by the photovoltaic power generation circuit 12 is 0 W, the inverter circuit 13 may control the energy storage circuit 11 to provide all electric energy of 60 W required by the alternating current power grid 14.

Figure 1B:
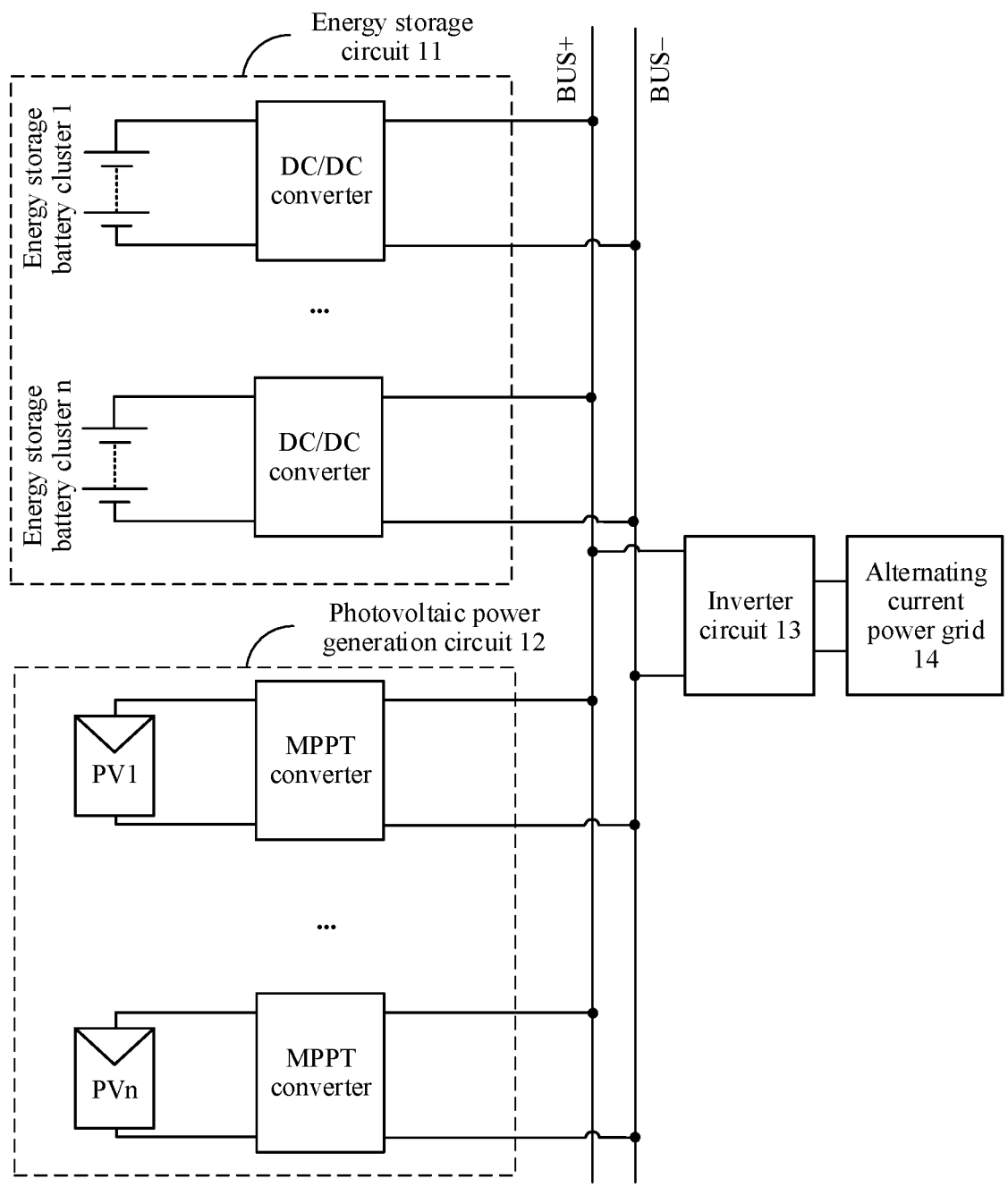
FIG. 1B is a schematic diagram of a structure of another photovoltaic energy system.

In a general scenario, as shown in FIG. 1B, the energy storage circuit 11 may include a plurality of conversion circuits connected in parallel on a bus, where each conversion circuit includes an energy storage battery cluster and a direct current-direct current (DC-DC) converter. The photovoltaic power generation circuit 12 may include a plurality of conversion circuits connected in parallel on the bus, where each conversion circuit includes a photovoltaic (PV) panel and a maximum power point tracking (MPPT) converter. Therefore, the photovoltaic power generation circuit, the energy storage circuit, and the inverter circuit each may be referred to as a conversion circuit.

The energy storage battery cluster included in the energy storage circuit 11 is configured to store and output electric energy. The DC-DC converter included in the energy storage circuit 11 is configured to perform voltage conversion between the battery cluster and the inverter circuit 13, so that a voltage corresponding to direct current electric energy can be adapted to voltages of both the battery cluster and the inverter circuit 13, or is configured to perform voltage conversion between the battery cluster and the photovoltaic power generation circuit 12, so that a voltage corresponding to direct current electric energy can be adapted to voltages of both the battery cluster and the photovoltaic power generation circuit 12. For example, assuming that a working voltage of the battery cluster is 100 V and a working voltage of the inverter circuit 13 is 1000 V, when the battery cluster outputs electric energy, that is, supplies power, the DC-DC converter is configured to convert electric energy provided from the battery cluster from 100 V to 1000 V, so that electric energy obtained after the voltage conversion can be adapted to the working voltage of the inverter circuit 13. Similarly, assuming that a working voltage of the battery cluster is 100 V and a working voltage of the photovoltaic power generation circuit 12 is 200 V, when the battery cluster stores electric energy, that is, performs charging, the DC-DC converter is configured to convert electric energy provided from the photovoltaic power generation circuit 12 from 200 V to 100 V, so that electric energy obtained after the voltage conversion can be adapted to the working voltage of the battery cluster.

The PV panel included in the photovoltaic power generation circuit 12 is configured to convert optical energy (for example, solar energy) into electric energy. The MPPT converter included in the photovoltaic power generation circuit 12 is configured to perform voltage conversion, so that the PV panel can work at a voltage corresponding to a maximum output power point, and further, the output power of the photovoltaic power generation circuit 12 can reach a maximum value. The maximum output power point at which the PV panel works is mainly detected by working temperature and light intensity of the PV panel. For example, at first temperature, a voltage corresponding to the maximum output power point at which the PV panel works is 100 V, and at second temperature, a voltage corresponding to the maximum output power point at which the PV panel works is 110 V. Therefore, in a scenario in which working temperature of the PV panel changes from the first temperature to the second temperature, to obtain a maximum output power, a working voltage of the PV panel is converted from 100 V to 110 V by using the MPPT converter.

In a photovoltaic energy system shown in FIG. 1B, because all the conversion circuits (the conversion circuit may be the energy storage circuit, the photovoltaic power generation circuit, or the inverter circuit described above) connected in parallel on the bus have quite high voltage classes, quickly and accurately identifying whether a ground insulation status of the photovoltaic energy system 10 is abnormal is quite important for safety of an operator, normal working of an electrical device, and safe operation of the photovoltaic energy system. However, currently, in most of existing insulation impedance detection solutions in a conventional technology, impact of a parasitic capacitance in a photovoltaic energy system is not considered. In addition, for a photovoltaic energy system in which a plurality of conversion circuits are connected in parallel, impact of a parasitic capacitance is more significant. Therefore, detection accuracy is low. It should be noted that, a parasitic capacitor in the photovoltaic energy system 10 is not an actual capacitor. The parasitic capacitor may mean mutual capacitance between wiring included in the system, where the mutual capacitance seems to be parasitic between the wiring. Alternatively, the parasitic capacitor may mean a capacitance included in the PV panel in the photovoltaic energy system 10, another unreal capacitor in the photovoltaic energy system 10, or the like.

In view of this, to accurately detect a ground insulation impedance obtained after one or more conversion circuits are connected in parallel, this application provides a photovoltaic energy system and a solution for detecting a ground insulation impedance. A detection circuit and a control circuit are added in the photovoltaic energy system, and a ground insulation impedance obtained after one or more conversion circuits are connected in parallel is detected through harmonic injection. In this way, whether an insulation status of the photovoltaic energy system satisfies a safe operation condition can be detected first based on the ground insulation impedance.

It should be noted that, in the description of this application, "at least one" means "one or more". "A plurality of" means two or more. In view of this, in embodiments of this application, "a plurality of" may also be understood as "at least two". The term "and/or" describes an association relationship between associated objects and indicates that three relationships may exist. For example, A and/or B may represent the following three cases: Only A exists, both A and B exist, and only B exists. In addition, it should be understood that in the description of this application, terms such as "first" and "second" are merely used for distinguishing and description, but should not be understood as indicating or implying relative importance, or should not be understood as indicating or implying a sequence.

Figure 2A:
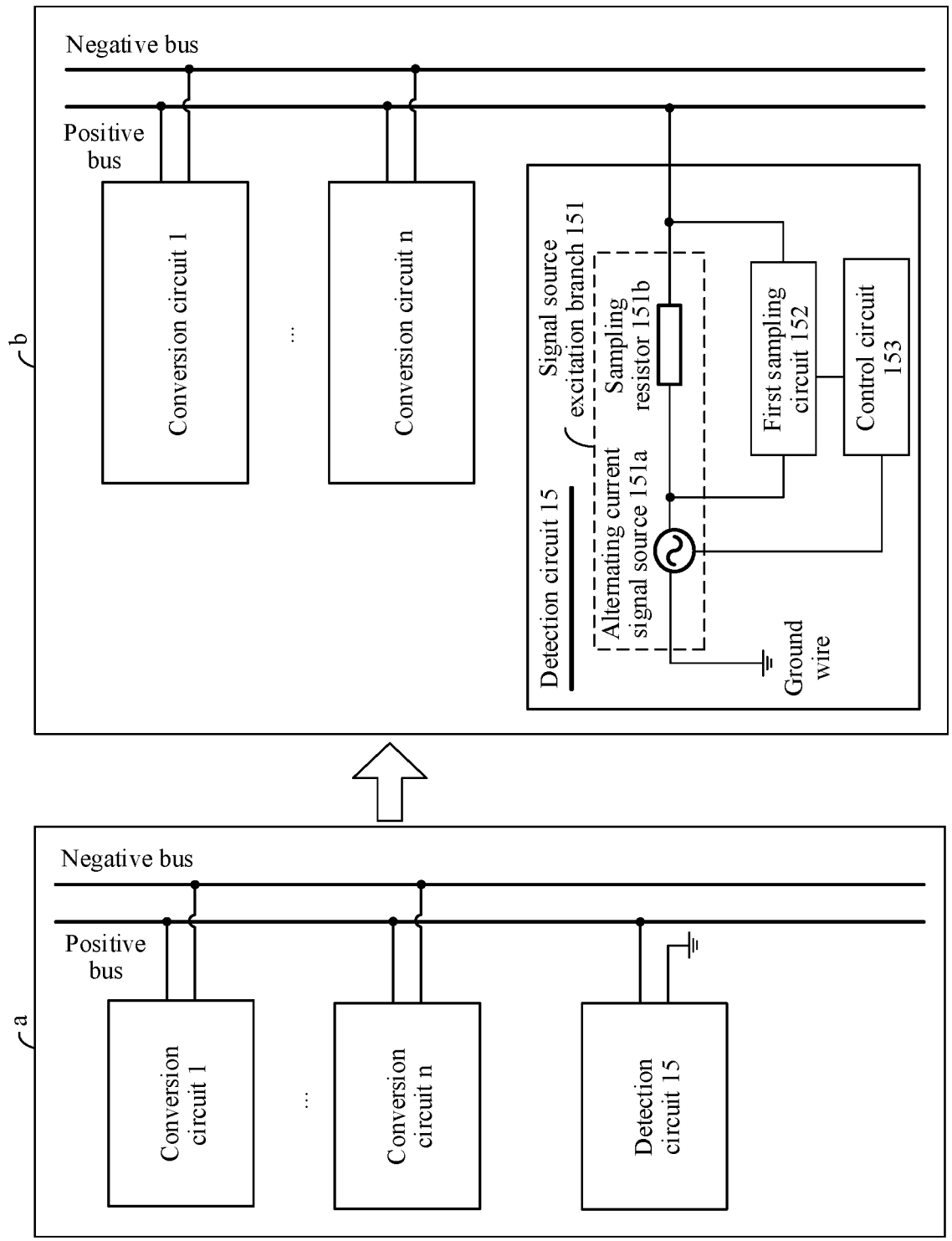
FIG. 2a is a schematic diagram 1 of a structure of a photovoltaic energy system according to an embodiment of this application.

FIG. 2a is a schematic diagram of a structure of a photovoltaic energy system according to this application. The photovoltaic energy system includes one or more conversion circuits (for example, a conversion circuit 1, ..., and a conversion circuit n that are included in FIG. 2a) and a detection circuit 15. The one or more conversion circuits are connected in parallel between a positive bus and a negative bus. Based on the foregoing descriptions of the photovoltaic energy system 10 in FIG. 1a and FIG. 1B, the conversion circuit may be the energy storage circuit 11, the photovoltaic power generation circuit 12, or the inverter circuit 13 described above. The detection circuit 15 includes a signal source excitation branch 151, a first sampling circuit 152, and a control circuit 153.

Figure 2B:
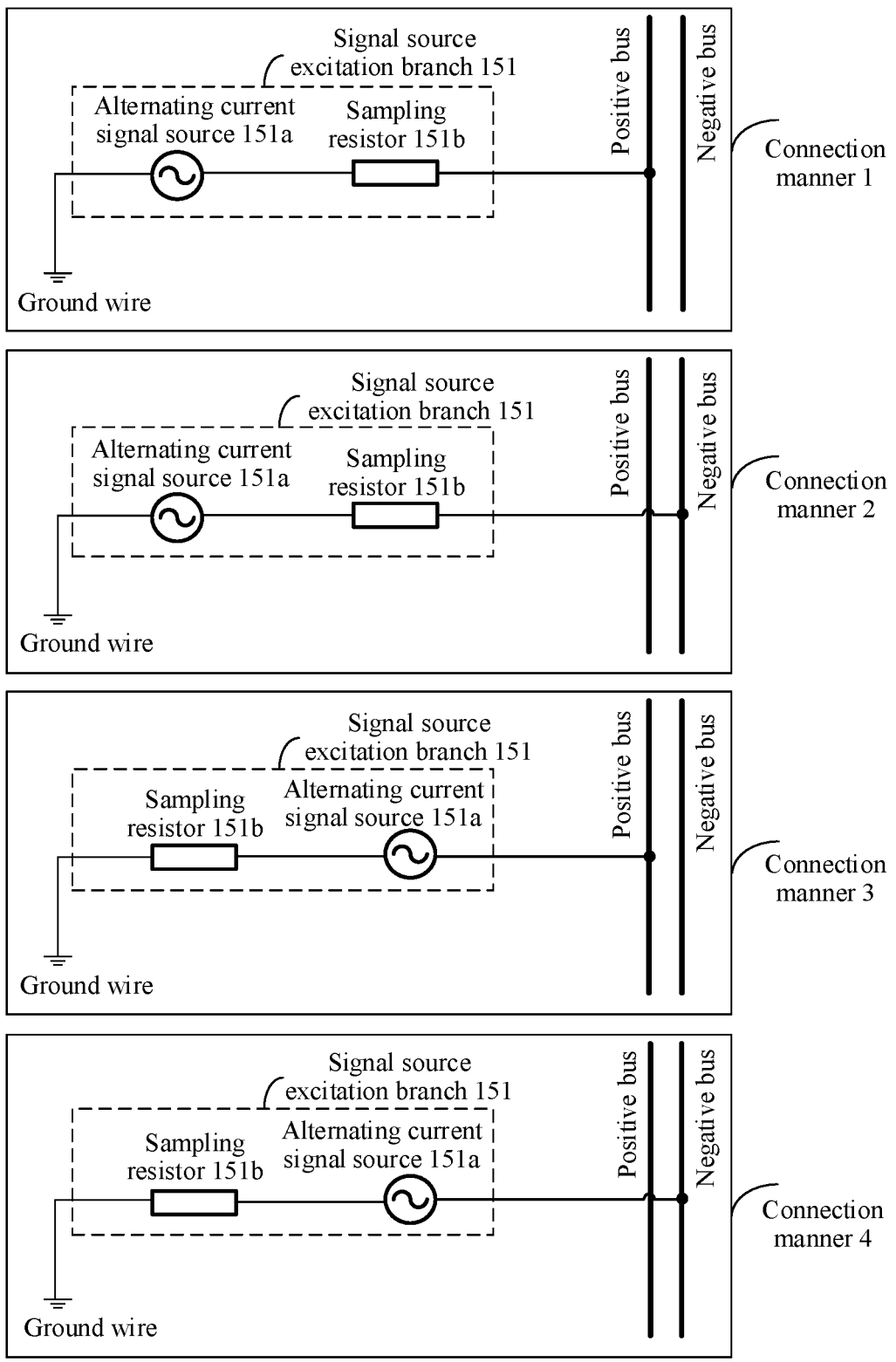
FIG. 2b is a schematic diagram of a structure of a signal source excitation branch according to an embodiment of this application.

One terminal of the signal source excitation branch 151 is connected to a ground wire and the other terminal of the signal source excitation branch 151 is connected to the positive bus or the negative bus (In FIG. 2a, that the other terminal of the signal source excitation branch 151 is connected to the positive bus is used as an example, and a manner in which the other terminal of the signal source excitation branch 151 is connected to the negative bus is not shown in FIG. 2a). The signal source excitation branch 151 may include an alternating current signal source 151a and a sampling resistor 151b that are connected in series. Based on this, four connection manners of the signal source excitation branch 151 may be obtained. As shown in FIG. 2b, a connection manner 1 and a connection manner 3 indicate that the signal source excitation branch 151 is connected between the positive bus and the ground wire. In addition, the connection manner 1 indicates that one terminal of the alternating current signal source 151a is connected to the ground wire, the other terminal of the alternating current signal source 151a is connected to the sampling resistor 151b, and the other terminal of the sampling resistor 151b is connected to the positive bus; and the connection manner 3 indicates that one terminal of the alternating current signal source 151a is connected to the positive bus, the other terminal of the alternating current signal source 151a is connected to the sampling resistor 151b, and the other terminal of the sampling resistor 151b is connected to the ground wire. Similarly, a connection manner 2 and a connection manner 4 indicate that the signal source excitation branch 151 is connected between the negative bus and the ground wire. Details are not described. It should be noted that, in FIG. 2a and subsequent embodiments, a description is provided by using an example in which the signal source excitation branch 151 uses the connection manner 1 shown in FIG. 2b.

The first sampling circuit 152 is connected in parallel to the sampling resistor 151b, and the control circuit 153 is connected to both an input terminal of the alternating current signal source and an output terminal of the first sampling circuit.

The control circuit 153 is configured to control the alternating current signal source 151a to output harmonic signals of a first frequency and a second frequency, where the first frequency is different from the second frequency. The first sampling circuit 152 is configured to: when the alternating current signal source 151a outputs the harmonic signal of the first frequency, collect a voltage at both terminals of the sampling resistor 151b to obtain a first voltage; when the alternating current signal source 151a outputs the harmonic signal of the second frequency, collect a voltage at both terminals of the sampling resistor 151b to obtain a second voltage; and send the first voltage and the second voltage to the control circuit 153. The control circuit 153 is further configured to detect, based on the harmonic signals of the first frequency and the second frequency, the first voltage, and the second voltage, a ground insulation impedance obtained after the one or more conversion circuits are connected in parallel.

Figures 1, 2C:
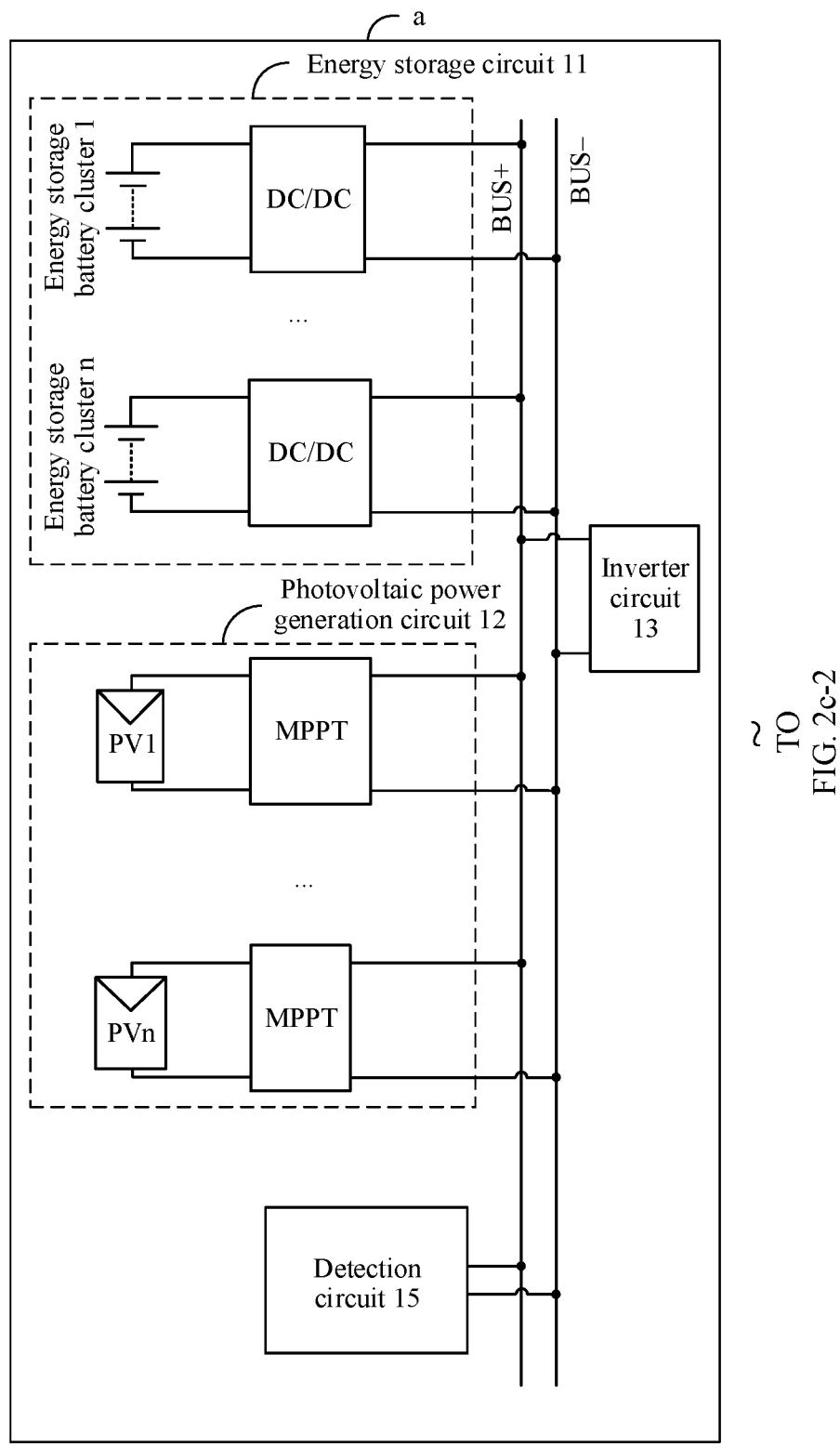
FIG. 2c-1 and FIG. 2c-2 are a schematic diagram 2 of a structure of a photovoltaic energy system according to an embodiment of this application.
Figures 2, 2C:
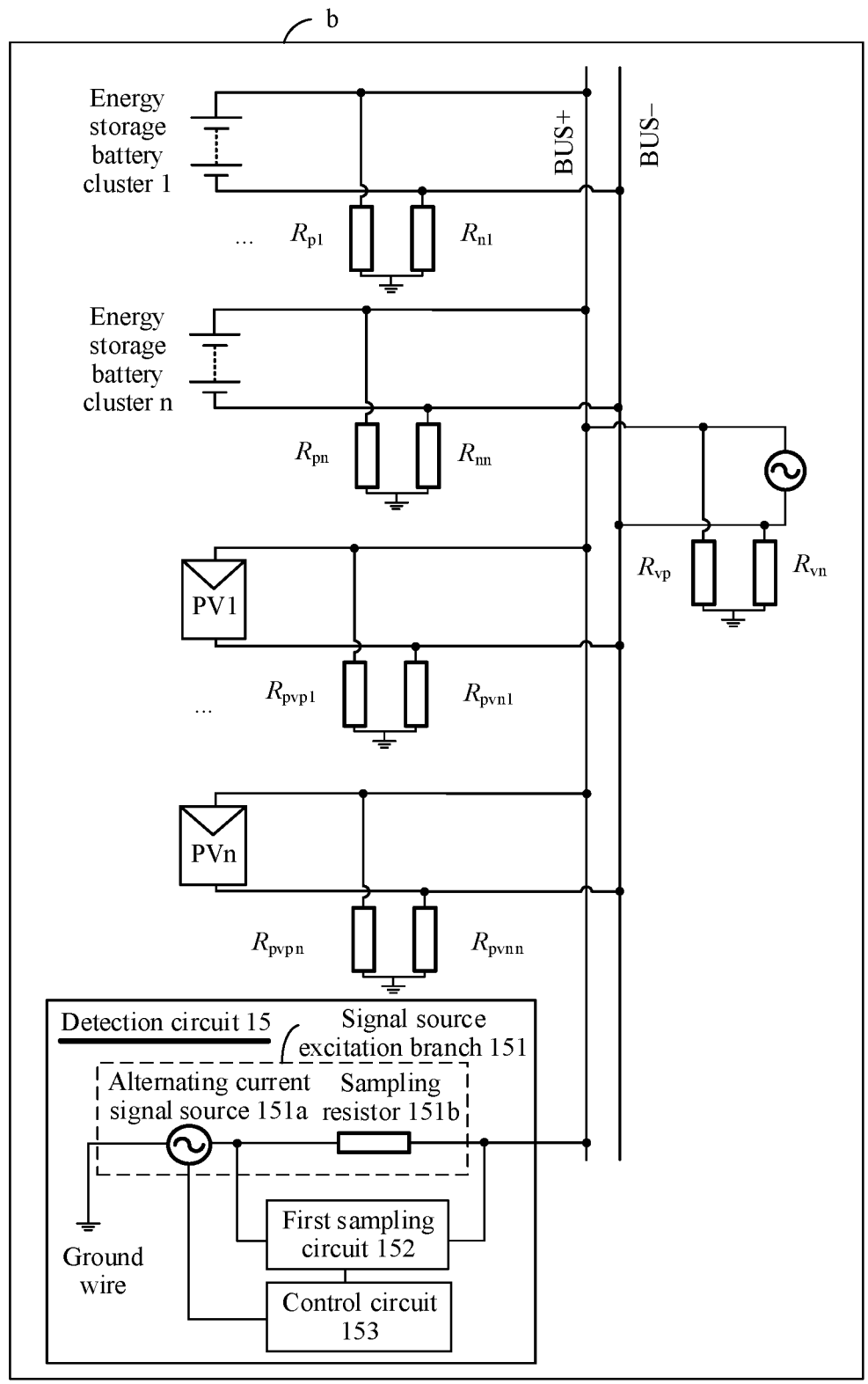

For better understanding of this embodiment of this application, a detailed description is provided by using an example in which the one or more conversion circuits are the photovoltaic energy system shown in FIG. 1B. As shown in FIG. 2c-1 and FIG. 2c-2, in FIG. 2c-1 and FIG. 2c-2, a represents a schematic diagram of a structure of the photovoltaic energy system, and b represents a diagram of a system equivalent circuit to which the photovoltaic energy system is equivalent. It can be understood that, by analyzing the system equivalent circuit, a working principle of the photovoltaic energy system provided in this application can be more clearly understood.

First, the system equivalent circuit shown by b in FIG. 2c-1 and FIG. 2c-2 is described. Usually, the conversion circuits included in the photovoltaic energy system may be connected in parallel on the bus in a common cathode mode or a common anode mode. In one embodiment of this application, a manner in which the conversion circuits included in the photovoltaic energy system are connected in parallel on the bus in the common cathode mode is used as an example. A system equivalent circuit is shown in a schematic circuit diagram shown by b in FIG. 2c-1 and FIG. 2c-2. If the conversion circuits included in the photovoltaic energy system are connected in parallel on the bus in the common anode mode, circuit analysis may be performed by using a principle that is the same as that in the foregoing. Details are not described in this application again.

For example, the DC-DC converter included in the photovoltaic energy system may be equivalent to a positive ground insulation impedance (for example, $R_{p1}, \ldots,$ and $R_{pn}$ shown in b in FIG. 2c-1 and FIG. 2c-2) of a battery cluster component and a negative ground insulation impedance (for example, $R_{n1}, \ldots,$ and $R_{nn}$ shown in b in FIG. 2c-1 and FIG. 2c-2) of the battery cluster component. The MPPT converter included in the photovoltaic energy system may be equivalent to a positive ground insulation impedance (for example, $R_{pvp1}, \ldots,$ and $R_{pvpn}$ shown in b in FIG. 2c-1 and FIG. 2c-2) of a PV panel and a negative ground insulation impedance (for example, $R_{pvn1}, \ldots,$ and $R_{pvnn}$ shown in b in FIG. 2c-1 and FIG. 2c-2) of the PV panel. The inverter circuit 13 included in the photovoltaic energy system may be equivalent to a positive ground insulation impedance (for example, $R_{vp}$ shown in b in FIG. 2c-1 and FIG. 2c-2) of an inverter component and a negative ground insulation impedance (for example, $R_{vn}$ shown in b in FIG. 2c-1 and FIG. 2c-2) of the inverter component.

For example, based on the manner in which the conversion circuits included in the photovoltaic energy system are connected in parallel on the bus, with reference to the system equivalent circuit shown by b in FIG. 2c-1 and FIG. 2c-2, a positive ground insulation impedance after the one or more conversion circuits are connected in parallel may be obtained according to Formula 1a:

$$R_p = R_{p1} // R_{p2} // \ldots // R_{pn} // R_{pvp1} // \ldots // R_{pvpn} // R_{vp} \quad \text{Formula 1a}$$

Similarly, a negative ground insulation impedance after the one or more conversion circuits are connected in parallel may be obtained according to Formula 1b:

$$R_n = R_{n1} // R_{n2} // \ldots // R_{nr} // R_{pvn1} // \ldots // R_{pvnr} // R_{vn} \quad \text{Formula 1b}$$

Figure 2D:
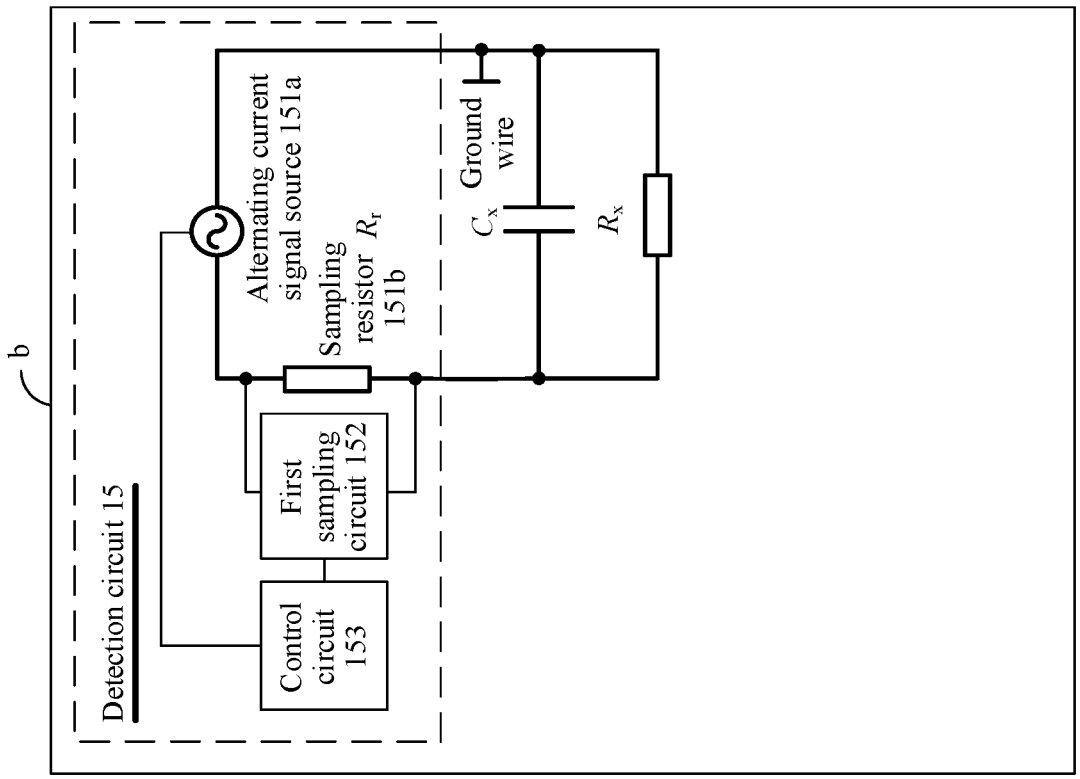
FIG. 2d is a schematic diagram 1 of an equivalent circuit of a photovoltaic energy system according to an embodiment of this application.

Based on Formula 1a and Formula 1b, the system equivalent circuit in FIG. 2c-1 and FIG. 2c-2 may be simplified to obtain a simplified equivalent circuit shown in FIG. 2d. The simplified equivalent circuit shown by a in FIG. 2d includes $R_p$, $R_n$, a positive parasitic capacitor $C_p$ obtained after the one or more conversion circuits are connected in parallel, a negative parasitic capacitor $C_n$ obtained after the one or more conversion circuits are connected in parallel, and a detection circuit 15. Considering impact of a parasitic capacitance in the photovoltaic energy system 10, the simplified equivalent circuit includes the positive parasitic capacitor $C_p$ obtained after the parallel connection and the negative parasitic capacitor $C_n$ obtained after the parallel connection.

Further, based on the simplified equivalent circuit shown by a in FIG. 2d, a ground insulation impedance $R_x$ obtained after the one or more conversion circuits are connected in parallel may be calculated based on a parallel impedance formula. In one embodiment, the ground insulation impedance is a parallel impedance of the positive ground insulation impedance and the negative ground insulation impedance that are obtained after the one or more conversion circuits are connected in parallel, and the ground insulation impedance $R_x$ obtained after the one or more conversion circuits are connected in parallel may be obtained according to Formula 1c:

$$R_x = \frac{1}{\frac{1}{R_p} + \frac{1}{R_n}} = \frac{R_p * R_n}{R_p + R_n} \quad \text{Formula 1c}$$

Similarly, according to a calculation rule for a plurality of capacitors that are connected in parallel, a total parasitic capacitance $C_x$ after the one or more conversion circuits are connected in parallel may be obtained according to Formula 1d:

$$C_x = C_p + C_n \quad \text{Formula 1d}$$

Based on Formula 1c and Formula 1d, the simplified equivalent circuit shown by a in FIG. 2d may be further simplified to obtain a simplified equivalent circuit shown by b in FIG. 2d.

In addition, in the simplified equivalent circuit shown in FIG. 2d, based on a superposition principle (to detect a function of each independent signal source, all other voltage sources in the circuit needs to be set to zero; this can also be understood as that each of all the other independent voltage sources may be replaced by a short circuit), it can be learned that, when the alternating current signal source 151a included in the detection circuit 15 works, it may be considered that an ideal direct current voltage source is short-circuited. This can also be understood as that: It may be considered that voltages of the battery cluster, the PV panel, the positive bus, and the negative bus that are included in the photovoltaic energy system are zero, in other words, it may be considered that the battery cluster, the PV panel, the positive bus, and the negative bus are wires. Therefore, the battery cluster, the PV panel, the positive bus, and the negative bus are not shown in FIG. 2d.

After the system structural diagram (as shown by a in FIG. 2c-1 and FIG. 2c-2), the system equivalent circuit (as shown by bin FIG. 2c-1 and FIG. 2c-2), and the simplified equivalent circuit (as shown by b in FIG. 2d) of the photovoltaic energy system provided in this application are described, the photovoltaic energy system 10 provided in this application is described below based on an embodiment.

The control circuit 153 controls the alternating current signal source to output harmonic signals of a first frequency and a second frequency, where the first frequency is different from the second frequency. For example, the control circuit 153 sends a drive signal to the alternating current signal source 151a, where the drive signal is used to drive the alternating current signal source 151a to output a harmonic signal of a specified frequency.

The first sampling circuit 152 is configured to: when the alternating current signal source 151a outputs the harmonic signal of the first frequency, collect a voltage at both terminals of the sampling resistor 151b to obtain a first voltage; when the alternating current signal source 151a outputs the harmonic signal of the second frequency, collect a voltage at both terminals of the sampling resistor 151b to obtain a second voltage; and send the first voltage and the second voltage to the control circuit.

The control circuit 153 detects, based on the harmonic signals of the first frequency and the second frequency, the first voltage, and the second voltage, a ground insulation impedance $R_x$ obtained after the one or more conversion circuits are connected in parallel.

In one embodiment, based on the simplified equivalent circuit shown by b in FIG. 2d, a total circuit impedance $Z_s$ in the simplified equivalent circuit may be obtained, and may be represented by Formula 2:

$$Z_s = R_r + \frac{1}{j\omega C_x} // R_x \quad \text{Formula 2}$$

where in Formula 2, ω represents a frequency of a harmonic signal injected by the alternating current signal source 151a, and is a known quantity; $R_r$ is an impedance value of the sampling resistor 151b, and is a known quantity; and $C_x$ and $R_x$ are used as unknown quantities during implementation of this application.

In the simplified equivalent circuit shown by b in FIG. 2d, based on a harmonic signal of a known frequency (for example, the first frequency or the second frequency described above) output by the alternating current signal source 151a, a maximum voltage $\dot{V}_s$ of the harmonic signal output by the alternating current signal source 151a may be detected; and a voltage $\dot{v}_r$ at both terminals of the sampling resistor 151b may be collected by using the first sampling circuit 152. In this case, based on a principle in which currents in a series circuit are equal to each other everywhere, Formula 3 may be obtained:

$$\left|\frac{\dot{v}_r}{R_r}\right| = \left|\frac{\dot{V}_s}{Z_s}\right| \quad \text{Formula 3}$$

Based on a principle described in Formula 3, when the alternating current signal source 151a outputs the harmonic signal of the first frequency (it is assumed that the first frequency is represented by $\omega_1$), the following Formula 4a may be obtained:

$$|\dot{v}_{r1}| = \left|\frac{R_r}{Z_s}V_s\right| = \left|\frac{R_r}{R_r + \frac{1}{j\omega_1 c_x} // R_x}\dot{V}_{s1}\right| \quad \text{Formula 4a}$$

where $|\dot{v}_{r1}|$ is used to represent the first voltage that is at both terminals of the sampling resistor $R_r$ and that is detected by the first sampling circuit when the harmonic signal of the first frequency is injected into the alternating current signal source 151a, and $|\dot{V}_{s1}|$ represents a maximum voltage of the harmonic signal of the first frequency.

Similarly, when the alternating current signal source 151a outputs the harmonic signal of the second frequency (it is assumed that the second frequency is represented by $\omega_2$), Formula 4b may be obtained:

$$|\dot{v}_{r2}| = \left|\frac{R_r}{Z_s}V_s\right| = \left|\frac{R_r}{R_r + \frac{1}{j\omega_2 c_x} // R_x}\dot{V}_{s2}\right| \quad \text{Formula 4b}$$

where $|\dot{v}_{r2}|$ is used to represent the second voltage that is at both terminals of the sampling resistor $R_r$ and that is detected by the first sampling circuit when the harmonic signal of the second frequency is injected into the alternating current signal source 151a, and $|\dot{V}_{s2}|$ represents a maximum voltage of the harmonic signal of the second frequency.

For example, Formula 4a and Formula 4b are combined, where unknown quantities are $R_x$ and $C_x$, and others are known quantities. Therefore, the ground insulation impedance $R_x$ obtained after the one or more conversion circuits are connected in parallel may be calculated. It should be noted that, Formula 4a and Formula 4b show only expression forms, and formula expression forms obtained after processing such as variation and shifting are performed on Formula 4a and Formula 4b all belong to this application.

It can be learned based on the foregoing calculation manner that, in one embodiment of this application, impact of a parasitic capacitance existing in the one or more conversion circuits is considered, and both the parasitic capacitance $C_x$ and the ground insulation impedance $R_x$ obtained after the one or more conversion circuits are connected in parallel are used as unknown quantities. Two harmonic signals of different frequencies are output by the alternating current signal source 151a by using a harmonic injection method, and then the ground insulation impedance $R_x$ obtained after the one or more conversion circuits are connected in parallel may be calculated by combining Formula 4a and Formula 4b. According to the photovoltaic energy system, because the calculated $R_x$ does not include a value of the parasitic capacitance $C_x$. Therefore, compared with a technical solution in a conventional technology in which impact of a parasitic capacitance is not considered, this application can improve accuracy of detecting an insulation status of the photovoltaic energy system, thereby improving safety of the photovoltaic energy system.

Figure 3:
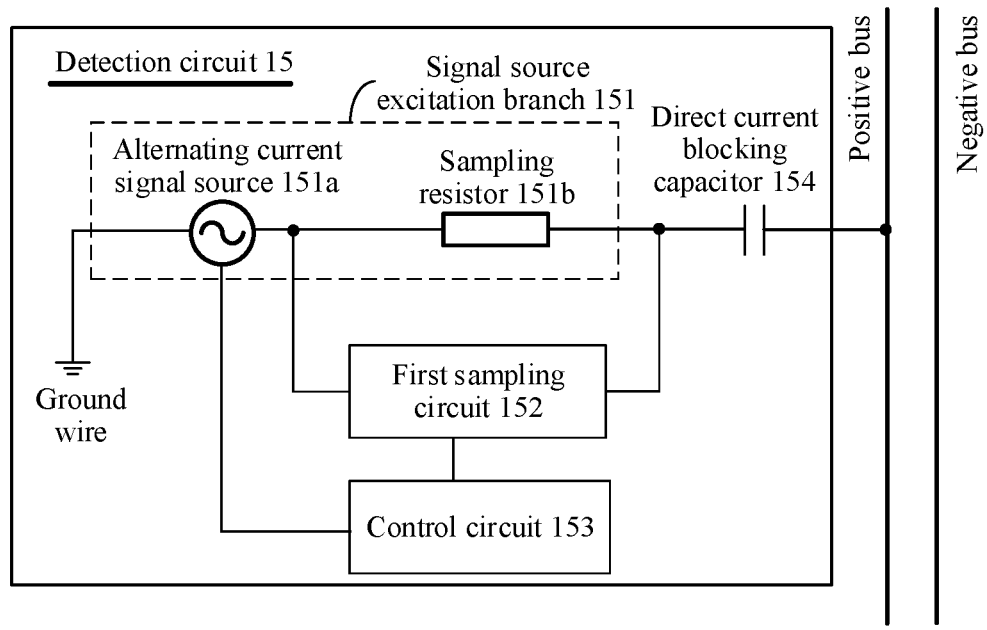
FIG. 3 is a schematic diagram 3 of a structure of a photovoltaic energy system according to an embodiment of this application.
Figure 4:
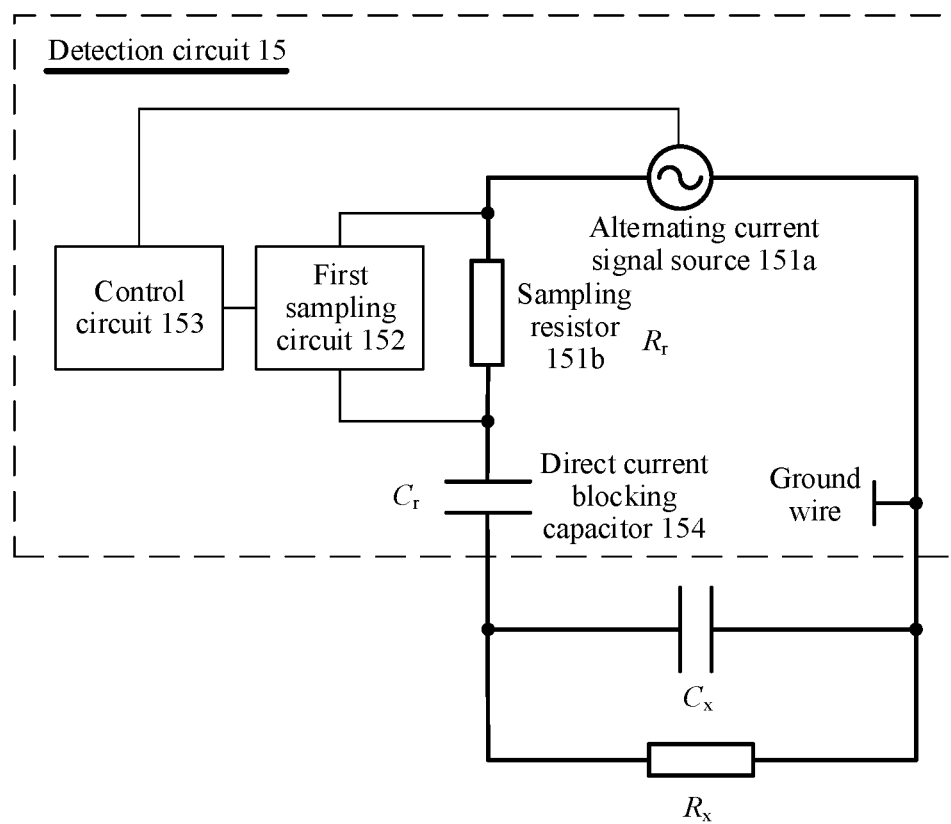
FIG. 4 is a schematic diagram 2 of an equivalent circuit of a photovoltaic energy system according to an embodiment of this application

In one embodiment, based on the harmonic injection implementation used in this application, to avoid impact of a direct current signal in the one or more conversion circuits on the signal source excitation branch 151, in one embodiment of this application, the detection circuit 15 may further include a direct current blocking capacitor 154, the other terminal of the signal source excitation branch 151 is connected to the positive bus or the negative bus through the direct current blocking capacitor 154, and the direct current blocking capacitor 154 is configured to isolate the direct current signal in the one or more conversion circuits for the detection circuit 15. As shown in FIG. 3, the direct current blocking capacitor may be configured to isolate a high voltage direct current signal input from the positive bus, to eliminate impact of the direct current signal in the detection circuit 15, thereby ensuring safe operation of the detection circuit 15. Based on a principle that is the same as that of the simplified equivalent circuit in FIG. 2d described above, an evolved equivalent circuit obtained after the detection circuit 15 includes the direct current blocking capacitor 154 is shown in FIG. 4. However, the direct current blocking capacitor 154 also affects detection accuracy of detecting, by the detection circuit 15, the ground insulation impedance $R_x$ obtained after the one or more conversion circuits are connected in parallel. Therefore, a direct current blocking capacitance also needs to be considered during calculation of $R_x$.

In this case, a total circuit impedance $Z_{s1}$ in the simplified equivalent circuit shown in FIG. 4 may be represented by Formula 5:

$$Z_{s1} = R_r + \frac{1}{j\omega C_r} + \frac{1}{j\omega C_x} // R_x \quad \text{Formula 5}$$

In one embodiment, based on a principle that is the same as those of the foregoing Formula 3, Formula 4a, and Formula 4b, Formula 6a and Formula 6b may be obtained:

$$|\dot{v}_{r1}| = \left|\frac{R_r}{z_{s1}}V_{s1}\right| = \left|\frac{R_r}{R_r + \frac{1}{j\omega_1 c_r} + \frac{1}{j\omega_1 c_x} // R_x}\dot{V}_{s1}\right| = \sqrt{\frac{(\omega_1 R_r C_r)^2 + (\omega_1^2 R_x R_r C_x C_r)^2}{(1 - \omega_1^2 R_x R_r C_x C_r^2)^2 + (\omega_1 R_x C_r + \omega_1 R_r C_r + \omega_1 R_x C_x)^2}}|\dot{V}_{s1}| \quad \text{Formula 6a}$$

$$|\dot{v}_{r2}| = \left|\frac{R_r}{z_{s1}}V_{s2}\right| = \left|\frac{R_r}{R_r + \frac{1}{j\omega_2 c_r} + \frac{1}{j\omega_2 c_x} // R_x}\dot{V}_{s2}\right| = \sqrt{\frac{(\omega_2 R_r C_r)^2 + (\omega_2^2 R_x R_r C_x C_r)^2}{(1 - \omega_2^2 R_x R_r C_x C_r^2)^2 + (\omega_2 R_x C_r + \omega_2 R_r C_r + \omega_2 R_x C_x)^2}}|\dot{V}_{s2}| \quad \text{Formula 6a}$$

Parameters included in Formula 6a and Formula 6b have same meanings as those in Formula 4a and Formula 4b described above, and details are not described herein again. However, during combination of Formula 6a and Formula 6b, if impact of the parasitic capacitance $C_x$ and the direct current blocking capacitance $C_r$ is considered during calculation of $R_x$, because there are three unknown quantities, at least three formulas need to be combined to calculate $R_x$. Based on this, in one embodiment of this application, the first sampling circuit 152 is further configured to: collect a first phase corresponding to the first voltage when the first voltage is collected, collect a second phase corresponding to the second voltage when the second voltage is collected, and send the first phase and the second phase to the control circuit.

According to a formula for calculating a phase in an alternating current circuit in a conventional technology, the following expression formula 6c of a first phase $\varphi_1$ and the following expression formula 6d of a second phase $\varphi_2$ may be obtained:

$$\varphi_1 = -\arctan \frac{1 - \omega_1^2 C_x^2 R_x^2 + \omega_1^2 C_r C_x R_x^2}{\omega_1 R_r C_r (1 - \omega_1^2 C_x^2 R_x^2) + \omega_1 R_x C_r} \quad \text{Formula 6c}$$

$$\varphi_2 = -\arctan \frac{1 - \omega_2^2 C_x^2 R_x^2 + \omega_2^2 C_r C_x R_x^2}{\omega_2 R_r C_r (1 - \omega_2^2 C_x^2 R_x^2) + \omega_2 R_x C_r} \quad \text{Formula 6d}$$

In this example, by combining Formula 6a to Formula 6d, any three of the formulas may be used to obtain results of the unknown quantities $C_r$, $C_x$, and $R_x$. Parameters included in Formula 6c and Formula 6d have same meanings as those in the formulas described above, and details are not described herein again. It should be noted that, Formula 6a to Formula 6d show only expression forms, and formula expression forms obtained after processing such as variation and shifting are performed on Formula 6a to Formula 6d all belong to this application.

Therefore, in one embodiment of this application, the control circuit 153 may be configured to detect, based on the harmonic signals of the first frequency and the second frequency, the first voltage, the second voltage, the first phase, and the second phase, the ground insulation impedance $R_x$ obtained after the one or more conversion circuits are connected in parallel.

Figure 5A:
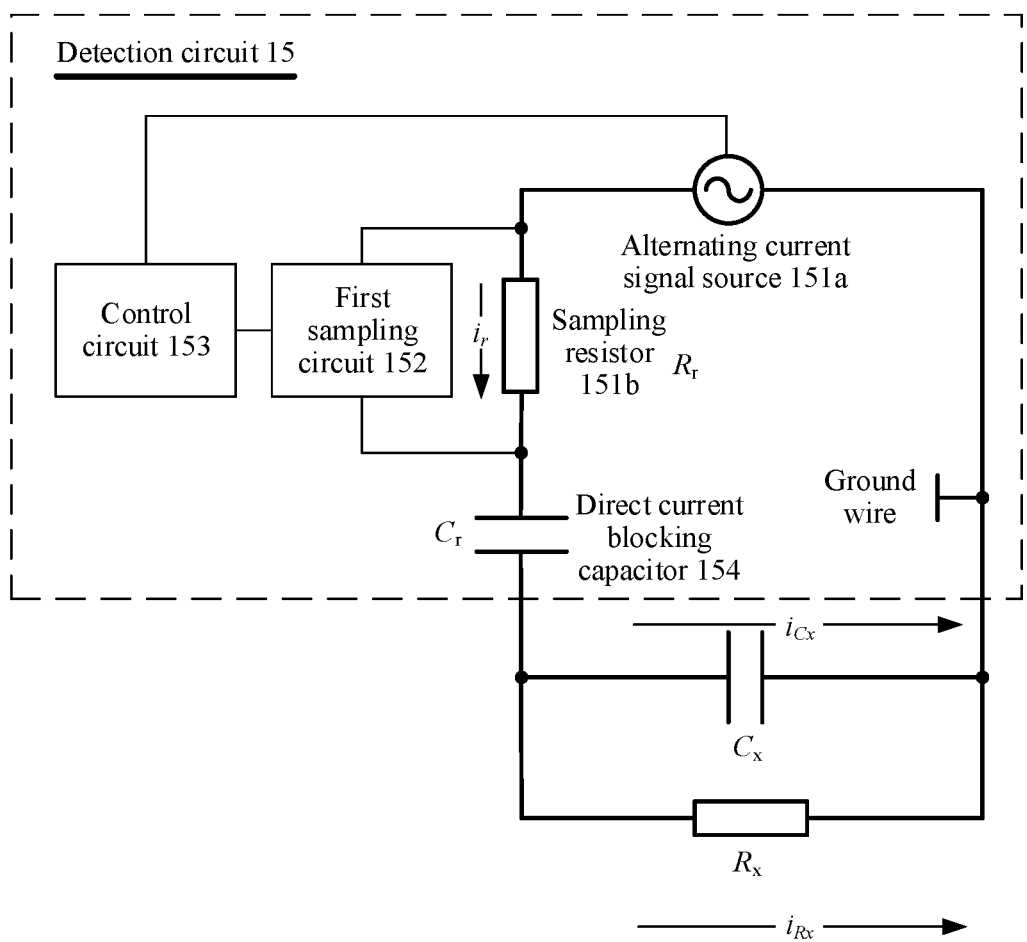
FIG. 5a is a schematic diagram 3 of an equivalent circuit of a photovoltaic energy system according to an embodiment of this application.
Figure 5B:
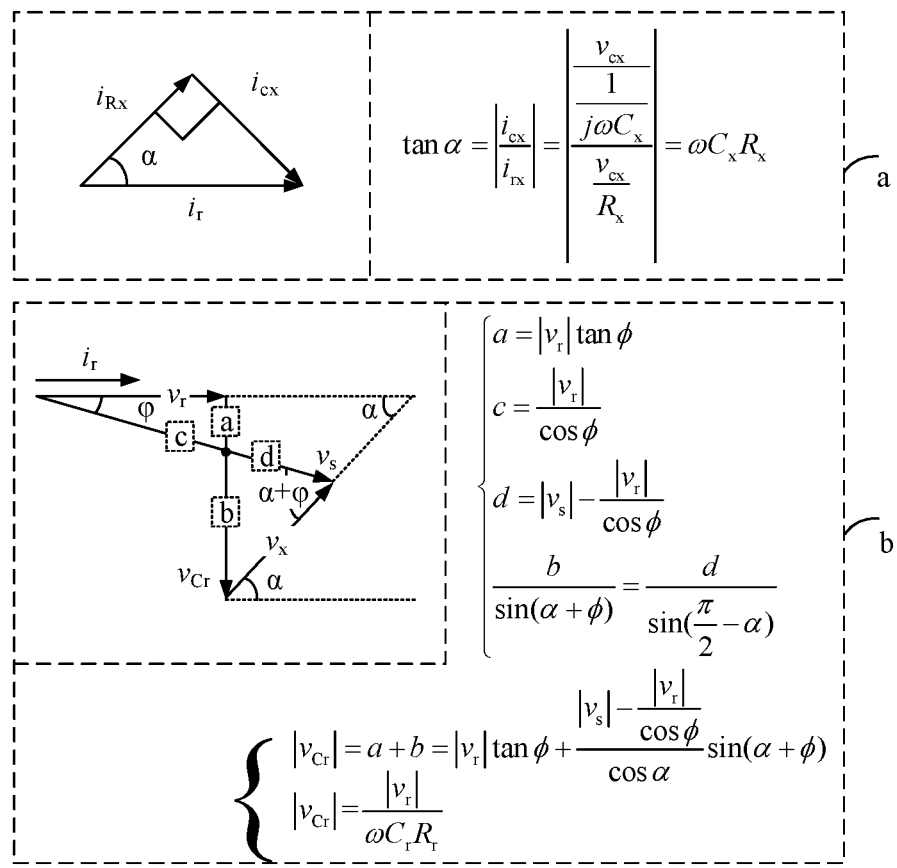
FIG. 5b is a schematic diagram of vectors of a photovoltaic energy system according to an embodiment of this application.

In one embodiment, during implementation of this application, a formula for calculating $R_x$ may be obtained based on a vector diagram. As shown in FIG. 5a and FIG. 5b, because an implementation of a harmonic injection method is used in this application, a voltage signal and a current signal in a simplified equivalent circuit in FIG. 5a are vector values (or referred to as vector values), in other words, the voltage signal and the current signal have directions. For example, a current $i_r$ of a sampling resistor $R_r$ in FIG. 5a is a trunk current in the simplified equivalent circuit, and is equal to a sum of a branch current $i_{cx}$ in a parasitic capacitor $C_x$ and a branch current $i_{Rx}$ in a ground insulation resistor $R_x$. For example, the current may be represented as $\vec{i}_r = \vec{i}_{cx} + \vec{i}_{Rx}$. It should be noted that, directions of the branch current $i_{cx}$ and the branch current $i_{Rx}$ are perpendicular to each other, as shown in a vector diagram shown by a in FIG. 5b. Assuming that an included angle between the directions of $i_{cx}$ and $i_{Rx}$ is $\alpha$, an expression of tam shown by a in FIG. 5b may be obtained.

Further, after the sampling resistor 151b receives the harmonic signals output by the alternating current signal source 151a, there are phase differences between phases of the alternating current signal source 151a when the alternating current signal source 151a outputs the harmonic signals and phases of the sampling resistor 151b, that is, the first phase and the second phase that respectively correspond to the first voltage and the second voltage at both terminals of the sampling resistor 151b and that are collected by the first sampling circuit 152. For ease of analysis, a direction of a voltage or a current collected at the sampling resistor 151b is used as an initial phase direction, so that a vector diagram shown by b in FIG. 5b can be obtained. $\varphi$ represents a phase difference between the sampling resistor 151b and the alternating current signal source 151a (where $\varphi$ may include the first phase $\varphi_1$ and the second phase $\varphi_2$). A voltage at both terminals of the direct current blocking capacitor 154 and a voltage at both terminals of the sampling resistor 151b are perpendicular to each other, and a maximum voltage $|V_s|$ of a harmonic signal output by the alternating current signal source 151a is a known quantity. An equation $\vec{V}_s = \vec{V}_r + \vec{V}_{cr} + \vec{V}_x$ may be obtained based on the simplified equivalent circuit shown in FIG. 5a. Therefore, the vector diagram shown by b in FIG. 5b can be obtained. $\vec{V}_x$ represents a voltage at both terminals of $C_x$ or $R_x$. Two expressions of $|V_{cr}|$ may be obtained based on the vector diagram shown in b in FIG. 5b. By combining the two expressions of $|V_{cr}|$, the following equations, namely, Formula 7a and Formula 7b, may be obtained:

$$\left| \dot{v}_{r1} \right| \tan\varphi_1 + \left( \left| \dot{V}_{s1} \right| - \frac{|\dot{v}_{r1}|}{\cos\varphi_1} \right)(\omega_1 C_x R_x \cos\varphi_1 + \sin\varphi_1) = \quad \text{Formula 7a}$$

$$\frac{|\dot{v}_{r1}|}{\omega_1 R_r C_r}$$

$$\left| \dot{v}_{r2} \right| \tan\varphi_2 + \left( \left| \dot{V}_{s2} \right| - \frac{|\dot{v}_{r2}|}{\cos\varphi_2} \right)(\omega_2 C_x R_x \cos\varphi_2 + \sin\varphi_2) = \quad \text{Formula 7b}$$

$$\frac{|\dot{v}_{r2}|}{\omega_2 R_r C_r}$$

Unknown quantities in Formula 7a and Formula 7b are $C_x$, $R_x$, and $C_r$, and an expression of $C_x R_x$, namely, Formula 7c, may be obtained by combining Formula 7a and Formula 7b.

$$C_x R_x = \frac{\omega_2 |\dot{v}_{r1}| |\dot{V}_{s2}| \sin\varphi_2 - \omega_1 |\dot{v}_{r2}| |\dot{V}_{s1}| \sin\varphi_1}{\omega_1^2 |\dot{v}_{r2}| |\dot{V}_{s1}| \cos\varphi_1 - \omega_1^2 |\dot{v}_{r2}| |\dot{v}_{r1}| - \omega_2^2 |\dot{v}_{r1}| \dot{V}_{s2}| \cos\varphi_2 + \omega_1^2 |\dot{v}_{r1}| |\dot{v}_{r2}|} \quad \text{Formula 7c}$$

Based on an expression of tam shown in a in FIG. 5b, it can be learned that $\alpha$ may be expressed in a form of Formula 7d.

$$\alpha = \arctan(\omega C_x R_x) \quad \text{Formula 7d}$$

In addition, based on the vector diagram shown in b in FIG. 5b, an equation $|\dot{v}_r| + |\vec{V}_x|\cos\alpha = |V_{s1}|\cos\varphi$ may be obtained, and further, an obtained expression of $R_x$ may be Formula 7e1 or Formula 7e2:

$$R_x = \frac{R_r(|\dot{V}_{s1}| \cos\varphi_1 - |\dot{v}_{r1}|)}{|\dot{v}_{r1}| \cos^2(\arctan(\omega_1 C_x R_x))} \quad \text{Formula 7e1}$$

$$R_x = \frac{R_r(|\dot{V}_{s2}| \cos\varphi_2 - |\dot{v}_{r2}|)}{|\dot{v}_{r2}| \cos^2(\arctan(\omega_2 C_x R_x))} \quad \text{Formula 7e2}$$

In addition, the obtained expression of $C_x R_x$ in Formula 7c is substituted into Formula 7e1 or Formula 7e2. In this case, it can be learned that a calculation formula of $R_x$ does not include unknown quantities $C_x$ and $C_r$. Therefore, it can be learned that, in this application, determining of $R_x$ is not affected by a parasitic capacitance and a direct current blocking capacitance, so that accuracy of detecting the ground insulation impedance can be improved.

In one embodiment of this application, after determining the ground insulation impedance $R_x$, the control circuit 153 may further analyze, based on the detected $R_x$, whether an insulation status of the one or more conversion circuits is abnormal. This may include the following scenarios:

Scenario 1: When the ground insulation impedance $R_x$ is greater than or equal to a first impedance threshold (it is assumed that the first impedance threshold is represented by $R_{th}$), that is, $R_x \geq R_{th}$, the control circuit 153 may detect that the insulation status of the one or more conversion circuits is normal. It can be understood that, if the ground insulation impedance obtained after the one or more conversion circuits are connected in parallel is large enough, it indicates that an insulation status of the photovoltaic energy system is normal, in other words, no ground insulation impedance fault occurs.

For example, assuming that $R_{th}$ is represented as a minimum acceptable ground insulation impedance, based on a principle that "a parallel impedance is less than any partial impedance" and on a basis that the ground insulation impedance $R_x$ is greater than or equal to $R_{th}$, it can be further deduced that both $R_p$ and $R_n$ are greater than $R_{th}$. Similarly, because $R_p$ and $R_n$ each are also obtained by calculating a parallel impedance of ground insulation impedances in a plurality of conversion circuits, it can be further deduced that all of $R_{pi}$ (values of i are 1 to n and vp1 to vpn), $R_{vp}$, $R_{ni}$ (values of i are 1 to n and vp1 to vpn), and $R_{vn}$ in each conversion circuit are also greater than $R_{th}$. Therefore, it can be learned that, in a scenario in which a ground insulation impedance in each conversion circuit in the photovoltaic energy system is detected, by determining that the ground insulation impedance obtained after the one or more conversion circuits are connected in parallel is greater than or equal to $R_{th}$, it can be deduced that an insulation status of each conversion circuit is normal.

Scenario 2: In contrast, when the ground insulation impedance $R_x$ is less than the first impedance threshold, the control circuit 153 cannot detect whether the insulation status of the one or more conversion circuits is normal. Therefore, whether the insulation status of the one or more conversion circuits is abnormal further needs to be detected.

In this scenario 2, based on $R_{th}/2$ used as a limit, there may be two possible detection cases for the control circuit 153.

Detection case 1: If the ground insulation impedance $R_x$ is less than a second impedance threshold (where the second impedance threshold is half of the first impedance threshold), that is, $R_x < R_{th}/2$, the control circuit 153 may detect that an abnormality exists in the one or more conversion circuits, and detect a conversion circuit whose insulation status is abnormal.

For example, it is assumed that $R_p$ is the minimum ground insulation impedance $R_{th}$. In this case, if it is detected that the ground insulation impedance $R_x$ is less than $R_{th}/2$, it is detected that at least $R_n$ is less than $R_{th}$. Therefore, the following case may be detected: When $R_x < R_{th}/2$, it may be detected that a value of at least one of $R_p$ and $R_n$ is less than $R_{th}$. Therefore, it may be detected that a ground insulation impedance in a conversion circuit is abnormal in this case in the one or more conversion circuits included in the photovoltaic energy system. In this case, fault locating needs to be performed.

Figures 1, 6A:
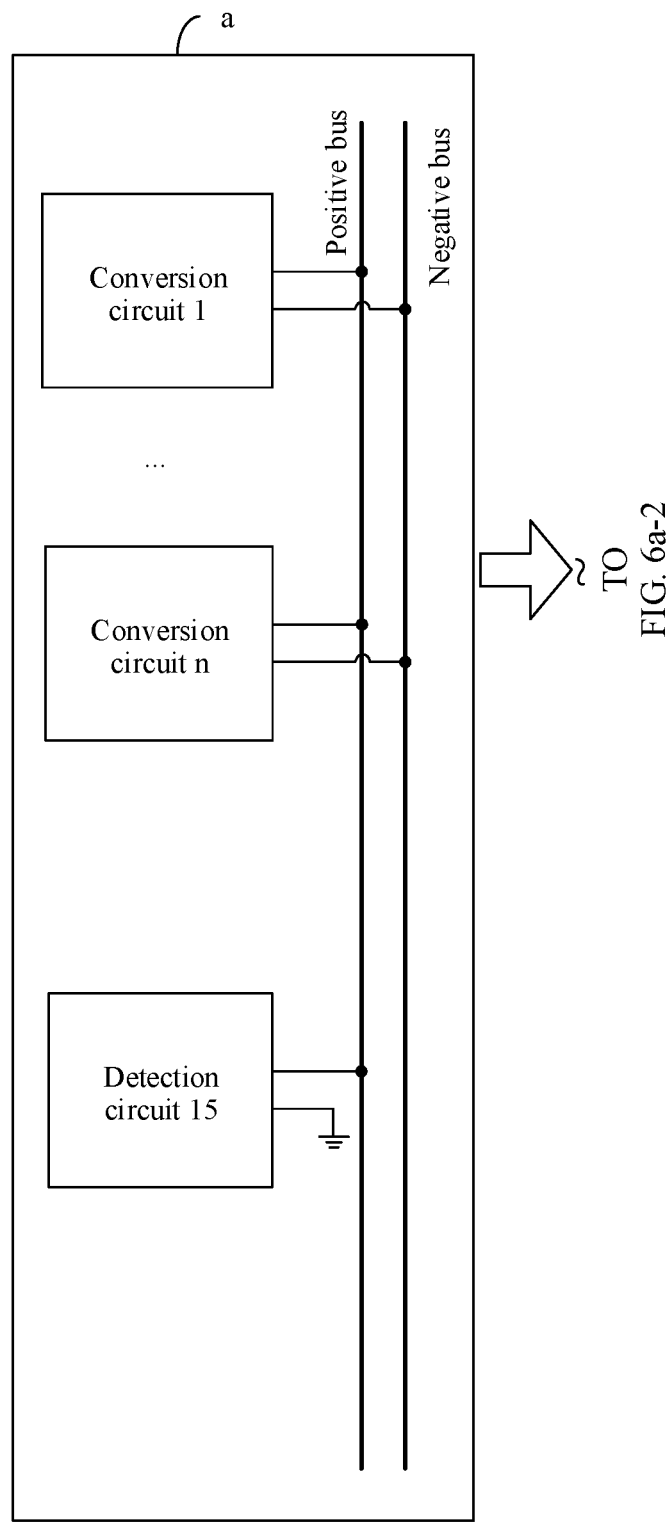

In one embodiment of this application, fault locating may be performed by using a leakage current detection method. For example, as shown in FIG. 6a-1 and FIG. 6a-2, the detection circuit 15 further includes a leakage current sampling circuit 156*i* (i is 1, . . . , and n) one-to-one connected to the one or more conversion circuits; an input terminal of each leakage current sampling circuit 156*i* is connected to both an input terminal and an output terminal of a conversion circuit connected to the leakage current sampling circuit 156*i*, and an output terminal of each leakage current sampling circuit 156*i* is connected to the control circuit 153; and each leakage current sampling circuit 156*i* is configured to: sample a first leakage current (it is assumed that the first leakage current is represented by $I_{pi}$) between the connected conversion circuit and the positive bus and a second leakage current (it is assumed that the second leakage current is represented by $I_{ni}$) between the connected conversion circuit and the negative bus to obtain a total leakage current (it is assumed that the total leakage current is represented by $I_i = I_{pi} + I_{ni}$) of the connected conversion circuit; and send the total leakage current to the control circuit 153.

After receiving the total leakage current of each conversion circuit, the control circuit 153 detects that an insulation status of a conversion circuit corresponding to a leakage current whose value is the largest in all the total leakage currents is abnormal. This can also be understood that a ground insulation impedance of the conversion circuit corresponding to the total leakage current whose value is the largest is the smallest. Therefore, an abnormality exists. For example, if a value of a total leakage current $I_1$ corresponding to the conversion circuit 1 is a maximum value in $I_i$ (i is 1, . . . , and n), it indicates that a ground insulation impedance in the conversion circuit 1 is the smallest, in other words, an insulation status of the conversion circuit 1 is abnormal.

In addition, to avoid a safety problem caused due to an abnormality in a plurality of conversion circuits, in one embodiment of this application, after the first abnormal conversion circuit is detected, the abnormal conversion circuit may be cut off, and detection on the remaining one or more conversion circuits continues to be performed by using the method for detecting a ground insulation impedance provided in this application, until insulation impedances of all of the remaining one or more conversion circuits are normal. For example, still refer to the example in the foregoing embodiment. The conversion circuit 1 whose insulation status is detected to be abnormal is cut off from the photovoltaic energy system, and ground insulation impedances of the remaining conversion circuits 2, . . . , and n are also detected by using the method provided in this application, to detect whether the remaining conversion circuits 2, . . . , and n include an abnormal conversion circuit.

Detection case 2: If the ground insulation impedance $R_x$ is less than the first impedance threshold $R_{th}$ and is greater than or equal to the second impedance threshold $R_{th}/2$, that is, $R_{th}/2 \leq R_x < R_{th}$, the control circuit 153 cannot detect whether an abnormality exists in the photovoltaic energy system. In this case, the control circuit 153 may further calculate a positive ground insulation impedance $R_p$ and a negative ground insulation impedance $R_n$. For example, based on analysis of the detection case 1 in the scenario 1 and the scenario 2, it may be detected that an insulation status of the photovoltaic energy system may be normal or abnormal when $R_{th}/2 \leq R_x < R_{th}$. Therefore, the insulation status of the photovoltaic energy system needs to be further detected.

In one embodiment, values of $R_p$ and $R_n$ may also be calculated by using the leakage current detection method. Still refer to FIG. 6a-1 and FIG. 6a-2. The detection circuit 15 may further include a second sampling circuit 155a and a third sampling circuit 155b; one terminal of the second sampling circuit 155a is connected to the positive bus and the other terminal of the second sampling circuit 155a is connected to the ground wire, and the second sampling circuit 155a is connected to the control circuit 153 and is configured to: sample a voltage between the positive bus and the ground wire to obtain a first bus voltage $V_{bus+}$, and send the first bus voltage to the control circuit 153; and one terminal of the third sampling circuit 155$b$ is connected to the negative bus and the other terminal of the third sampling circuit 155$b$ is connected to the ground wire, and the third sampling circuit 155$b$ is connected to the control circuit 153 and is configured to: sample a voltage between the negative bus and the ground wire to obtain a second bus voltage $V_{bus-}$, and send the second bus voltage to the control circuit 153.

Figures 2, 6A:
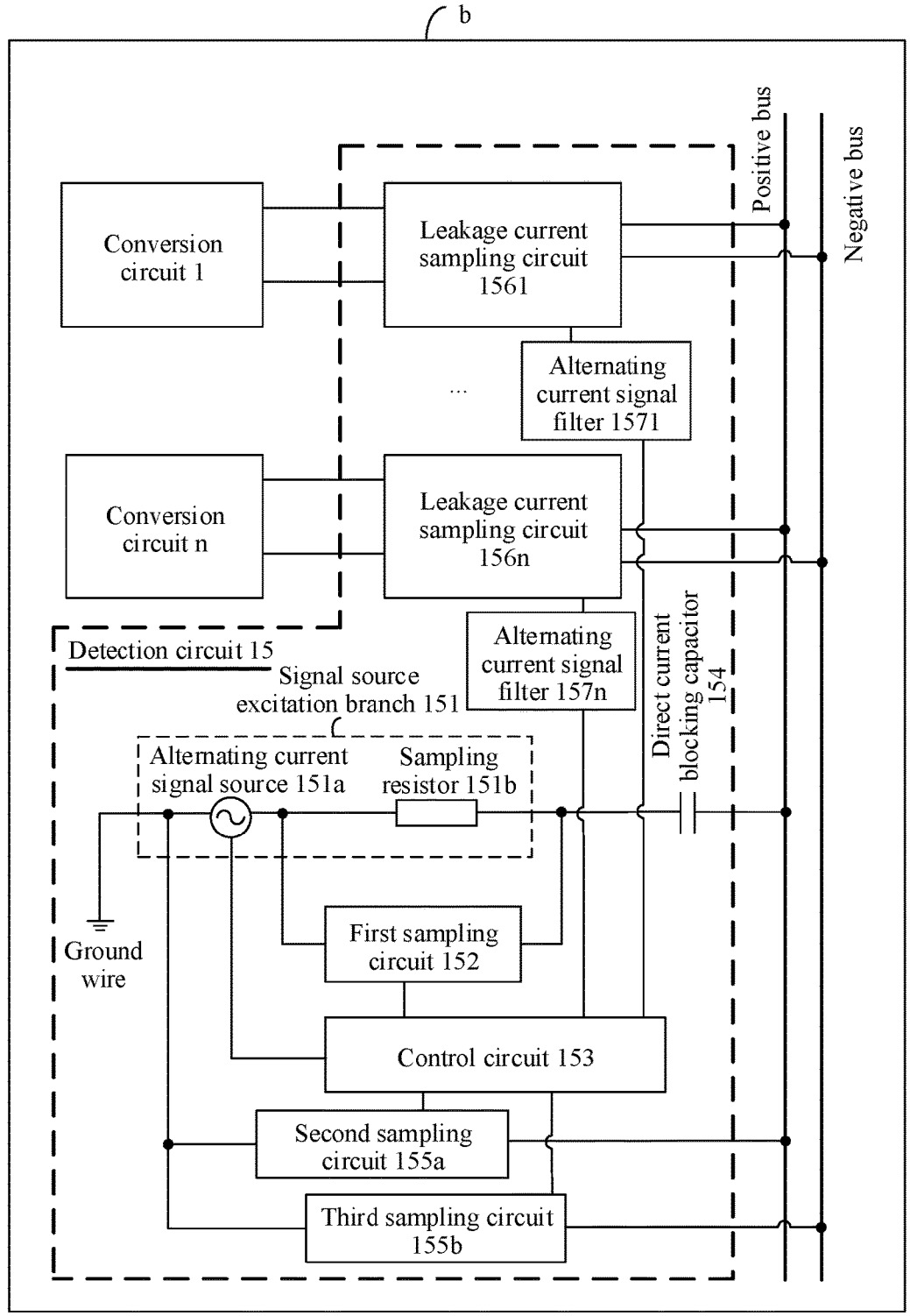
Figure 6B:
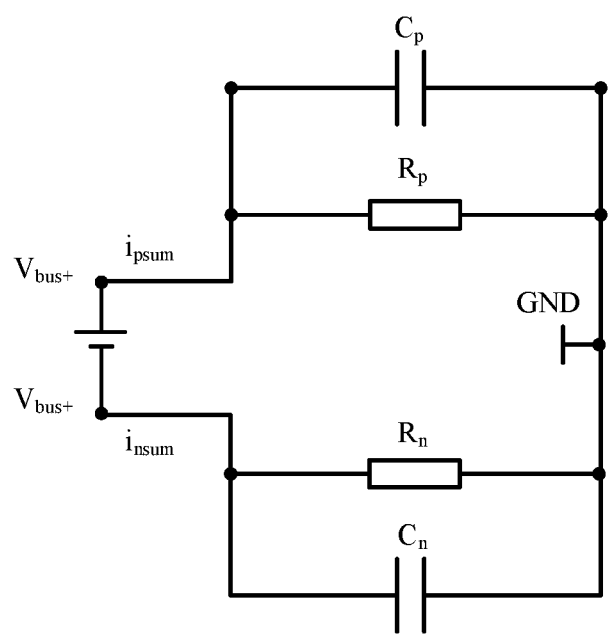
FIG. 6b is a schematic diagram 4 of an equivalent circuit of a photovoltaic energy system according to an embodiment of this application.

For example, whether an abnormality exists in the photovoltaic energy system is detected by using the leakage current detection method. Because the first leakage current $I_{pi}$ and the second leakage current $I_{ni}$ of each conversion circuit may be collected by the leakage current sampling circuit 156$i$ shown in FIG. 6$a$-1 and FIG. 6$a$-2, a sum $I_{psum}$ of the first leakage currents and a sum $I_{nsum}$ of the second leakage currents in the one or more conversion circuits may be further calculated during implementation, as shown in Formula 8a and Formula 8b:

$$I_{psum} = \Sigma_{i=1}^{n} I_{pi} \qquad \text{Formula 8a}$$

$$I_{nsum} = \Sigma_{i=1}^{n} I_{ni} \qquad \text{Formula 8b}$$

It should be noted that, after sampling the leakage currents, the leakage current sampling circuit may further convert the leakage currents into a voltage based on a characteristic of the photovoltaic energy system by using a conversion coefficient k. The conversion coefficient k may be detected in advance based on the characteristic of the photovoltaic energy system. Therefore, an expression of $V_E$ may be obtained, as shown in Formula 8c:

$$V_E = k(I_{psum} + I_{nsum}) \qquad \text{Formula 8c}$$

In addition, the sum $I_{psum}$ of the first leakage currents in the one or more conversion circuits may alternatively be represented by using the sampled first bus voltage $V_{bus+}$ and the positive ground insulation impedance $R_p$. Similarly, $I_{nsum}$ may alternatively be represented by using $V_{bus-}$ and the positive ground insulation impedance $R_n$. Therefore, Formula 8d may be obtained:

$$V_E = k\left(\frac{V_{bus+}}{R_p} + \frac{V_{bus-}}{R_n}\right) \qquad \text{Formula 8d}$$

$$R_x = \frac{R_p * R_n}{R_p + R_n} \qquad \text{Formula 8e}$$

Values of unknown quantities $R_p$ and $R_n$ may be calculated by combining Formula 8d and Formula 1c.

After the values of the unknown quantities $R_p$ and $R_n$ are calculated, a value relationship between $R_{th}$ and each of $R_p$ and $R_n$ may be further detected. It can be understood that, when $R_p$ is greater than or equal to $R_{th}$, it is detected that an insulation status of the one or more conversion circuits between the positive bus and the ground wire is normal; otherwise, it is detected that an insulation status of the one or more conversion circuits between the positive bus and the ground wire is abnormal; and when $R_n$ is greater than or equal to $R_{th}$, it is detected that an insulation status of the one or more conversion circuits between the negative bus and the ground wire is normal; otherwise, it is detected that an insulation status of the one or more conversion circuits between the negative bus and the ground wire is abnormal. In addition, for example, if it is detected that an abnormality exists between the positive bus and the ground wire, fault locating may be further performed on a circuit component (for example, a DC-DC converter or an MPPT converter) connected to the positive bus.

It should be noted that, after an abnormal conversion circuit is detected through locating, the control circuit 153 may send alarm information to a main scheduling unit of the photovoltaic energy system, so that maintenance personnel may be reminded to maintain the photovoltaic energy system to eliminate a potential safety hazard.

During detection performed by using the leakage current detection method, because a leakage current collected from a conversion circuit includes an alternating current signal output by the alternating current signal source 151$a$ and a direct current signal in the conversion circuit, to ensure accuracy of detecting the ground insulation impedance, before determining the ground insulation impedance based on a leakage current, the control circuit 153 needs to filter out an alternating current signal included in the leakage current.

One embodiment is an analog filtering manner. Still refer to FIG. 6$a$-1 and FIG. 6$a$-2. In one embodiment, the detection circuit 15 further includes an alternating current signal filter 157$i$ (i is 1, . . . , and n) one-to-one connected to each leakage current sampling circuit 156$i$; an input terminal of each alternating current signal filter 157$i$ is connected to a leakage current sampling circuit 156$i$ corresponding to the alternating current signal filter 157$i$, and an output terminal of each alternating current signal filter 157$i$ is connected to the control circuit 153; and the alternating current signal filter 157$i$ is configured to filter out an alternating current signal included in a total leakage current of the conversion circuit sampled by the leakage current sampling circuit 156$i$. The alternating current signal filter 157$i$ may be implemented by a low-pass filter or a wavetrap.

One embodiment is a digital filtering manner. In one embodiment, the control circuit 153 is further configured to: receive a total leakage current that is sampled by a target leakage current sampling circuit 156$i$ and that is of a conversion circuit connected to the target leakage current sampling circuit, where the target leakage current sampling circuit is any one of all the leakage current sampling circuits; and after performing analog-to-digital conversion on the total leakage current of the conversion circuit connected to the target leakage current sampling circuit, filter out an alternating current signal included in a total leakage current obtained after the analog-to-digital conversion.

It should be noted that, the method for detecting a ground insulation impedance provided in this application may also be applied to detection of a ground insulation impedance of any high voltage direct current system, for example, an electric vehicle or a power battery.

According to the method provided in the embodiments of this application, this application further provides a chip, for example, a chip in an inverter. The chip is configured to perform the method in any one of the embodiments shown in FIG. 1$a$ to FIG. 6$b$.

It should be understood that, the foregoing embodiments or the implementations in the embodiments may be used in combination.

A person skilled in the art should understand that embodiments of this application may be provided as a method, a system, or a computer program product. Therefore, this application may use a form of hardware only embodiments, software only embodiments, or embodiments with a combination of software and hardware. Moreover, this application may use a form of a computer program product that is implemented on one or more computer-usable storage media (including but not limited to a disk memory, a CD-ROM, an optical memory, and the like) that include computer-usable program code.

This application is described with reference to the flowcharts and/or block diagrams of the method, the device (system), and the computer program product according to this application. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, so that the instructions executed by the computer or the processor of the any other programmable data processing device generate an apparatus for implementing a function in one or more processes in the flowcharts and/or in one or more blocks in the block diagrams.

These computer program instructions may alternatively be stored in a computer readable memory that can instruct a computer or any other programmable data processing device to work in a manner, so that the instructions stored in the computer readable memory generate an artifact that includes an instruction apparatus. The instruction apparatus implements a function in one or more processes in the flowcharts and/or in one or more blocks in the block diagrams.

These computer program instructions may alternatively be loaded onto a computer or any other programmable data processing device, so that a series of operations and operations are performed on the computer or the any other programmable device, thereby generating computer-implemented processing. Therefore, the instructions executed on the computer or the any other programmable device provide operations for implementing a function in one or more processes in the flowcharts and/or in one or more blocks in the block diagrams.

It is clear that, a person skilled in the art can make various modifications and variations to this application without departing from the scope of this application. This application is intended to cover these modifications and variations of this application provided that they fall within the scope of protection defined by the following claims and their equivalent technologies.

What is claimed is:

1. A photovoltaic energy system comprising:
one or more conversion circuits; and
a detection circuit, wherein the one or more conversion circuits are connected in parallel between a positive bus and a negative bus;
wherein, the detection circuit comprises a signal source excitation branch, a first sampling circuit, and a control circuit; one terminal of the signal source excitation branch is connected to a ground wire, and the other terminal of the signal source excitation branch is connected to the positive bus or the negative bus; the signal source excitation branch comprises an alternating current signal source and a sampling resistor that are connected in series; and the first sampling circuit is connected in parallel to the sampling resistor, and the control circuit is connected to both an input terminal of the alternating current signal source and an output terminal of the first sampling circuit;
the control circuit is configured to control the alternating current signal source to output harmonic signals of a first frequency and a second frequency, wherein the first frequency is different from the second frequency;
the first sampling circuit is configured to: when the alternating current signal source outputs the harmonic signal of the first frequency, collect a voltage at both terminals of the sampling resistor to obtain a first voltage; when the alternating current signal source outputs the harmonic signal of the second frequency, collect a voltage at both terminals of the sampling resistor to obtain a second voltage; and send the first voltage and the second voltage to the control circuit; and
the control circuit is further configured to obtain, based on the harmonic signals of the first frequency and the second frequency, the first voltage, and the second voltage, a ground insulation impedance obtained after the one or more conversion circuits are connected in parallel.

2. The photovoltaic energy system according to claim 1, wherein, the detection circuit further comprises a direct current blocking capacitor, the other terminal of the signal source excitation branch is connected to the positive bus or the negative bus through the direct current blocking capacitor, and the direct current blocking capacitor is configured to isolate a direct current signal in the one or more conversion circuits for the detection circuit.

3. The photovoltaic energy system according to claim 1, wherein, the first sampling circuit is further configured to: collect a first phase corresponding to the first voltage when the first voltage is collected, collect a second phase corresponding to the second voltage when the second voltage is collected, and send the first phase and the second phase to the control circuit; and
the control circuit is configured to detect, based on the harmonic signals of the first frequency and the second frequency, the first voltage, the second voltage, the first phase, and the second phase, the ground insulation impedance obtained after the one or more conversion circuits are connected in parallel.

4. The photovoltaic energy system according to claim 1, wherein, the control circuit is further configured to: when the ground insulation impedance is greater than or equal to a first impedance threshold, detect that an insulation status of the one or more conversion circuits is normal.

5. The photovoltaic energy system according to claim 4, wherein, the detection circuit further comprises a leakage current sampling circuit one-to-one connected to the one or more conversion circuits, an input terminal of each leakage current sampling circuit is connected to both an input terminal and an output terminal of a conversion circuit connected to the leakage current sampling circuit, and an output terminal of each leakage current sampling circuit is connected to the control circuit;
wherein, each leakage current sampling circuit is configured to: sample a first leakage current between the connected conversion circuit and the positive bus and a second leakage current between the connected conversion circuit and the negative bus to obtain a total leakage current of the connected conversion circuit; and send the total leakage current to the control circuit.

6. The photovoltaic energy system according to claim 5, wherein, the control circuit is further configured to: when the ground insulation impedance is less than a second impedance threshold, detect that an insulation status of a conversion circuit corresponding to a total leakage current whose value is the largest in the total leakage currents sent by all the leakage current sampling circuits is abnormal, wherein the second impedance threshold is half of the first impedance threshold.

7. The photovoltaic energy system according to claim 6, wherein, the detection circuit further comprises a second sampling circuit and a third sampling circuit, wherein,
  one terminal of the second sampling circuit is connected to the positive bus and the other terminal of the second sampling circuit is connected to the ground wire, and the second sampling circuit is connected to the control circuit and is configured to: sample a voltage between the positive bus and the ground wire to obtain a first bus voltage, and send the first bus voltage to the control circuit;
  wherein, one terminal of the third sampling circuit is connected to the negative bus and the other terminal of the third sampling circuit is connected to the ground wire, and the third sampling circuit is connected to the control circuit and is configured to: sample a voltage between the negative bus and the ground wire to obtain a second bus voltage, and send the second bus voltage to the control circuit.

8. The photovoltaic energy system according to claim 7, wherein, the control circuit is further configured to:
  when the ground insulation impedance is less than the first impedance threshold and greater than or equal to the second impedance threshold, detect, based on the first leakage current and the second leakage current of each conversion circuit, the first bus voltage, the second bus voltage, and the ground insulation impedance, a positive ground insulation impedance obtained after the one or more conversion circuits are connected in parallel between the positive bus and the ground wire and a negative ground insulation impedance obtained after the one or more conversion circuits are connected in parallel between the negative bus and the ground wire.

9. The photovoltaic energy system according to claim 8, wherein, when the positive ground insulation impedance is greater than or equal to the first impedance threshold, the control circuit is further configured to:
  detect that an insulation status of the one or more conversion circuits between the positive bus and the ground wire is normal, otherwise,
  detect that an insulation status of the one or more conversion circuits between the positive bus and the ground wire is abnormal.

10. The photovoltaic energy system according to claim 8, wherein, when the negative ground insulation impedance is greater than or equal to the first impedance threshold, the control circuit is further configured to:
  detect that an insulation status of the one or more conversion circuits between the negative bus and the ground wire is normal, else, and
  detect that an insulation status of the one or more conversion circuits between the negative bus and the ground wire is abnormal.

11. The photovoltaic energy system according to claim 7, wherein, the detection circuit further comprises an alternating current signal filter one-to-one connected to each leakage current sampling circuit, an input terminal of each alternating current signal filter is connected to a leakage current sampling circuit corresponding to the alternating current signal filter, and an output terminal of each alternating current signal filter is connected to the control circuit; and
  the alternating current signal filter is configured to filter out an alternating current signal comprised in a total leakage current of the conversion circuit sampled by the leakage current sampling circuit.

12. The photovoltaic energy system according to claim 7, wherein, the control circuit is further configured to:
  receive a total leakage current that is sampled by a target leakage current sampling circuit and that is of a conversion circuit connected to the target leakage current sampling circuit, wherein, the target leakage current sampling circuit is any one of all the leakage current sampling circuits; and
  after performing analog-to-digital conversion on the total leakage current of the conversion circuit connected to the target leakage current sampling circuit, filter out an alternating current signal comprised in a total leakage current obtained after the analog-to-digital conversion.

13. The photovoltaic energy system according to claim 1, wherein, the ground insulation impedance satisfies the following formulas:

$$|\dot{v}_{r1}| = \left| \frac{R_r}{R_r + \frac{1}{j\omega_1 C_x} // R_x} \dot{V}_{s1} \right|$$

$$|\dot{v}_{r2}| = \left| \frac{R_r}{R_r + \frac{1}{j\omega_2 C_x} // R_x} \dot{V}_{s2} \right|$$

wherein $|\dot{v}_{r1}|$ represents the first voltage, and $|\dot{v}_{r2}|$ represents the second voltage; $\omega_1$ represents the harmonic signal of the first frequency, and $\omega_2$ represents the harmonic signal of the second frequency; $R_r$ represents an impedance of the sampling resistor, $R_x$ represents the ground insulation impedance, and $C_x$ represents a capacitance value of a parasitic capacitor in the photovoltaic energy system; and $|\dot{V}_{s1}|$ represents a maximum voltage of the harmonic signal of the first frequency, and $|\dot{V}_{s2}|$ represents a maximum voltage of the harmonic signal of the second frequency.

14. The photovoltaic energy system according to claim 3, wherein, the ground insulation impedance satisfies the following formulas:

$$|\dot{v}_{r1}| = \left| \frac{R_r}{R_r + \frac{1}{j\omega_1 C_r} + \frac{1}{j\omega_1 C_x} // R_x} \dot{V}_{s1} \right|$$

$$|\dot{v}_{r2}| = \left| \frac{R_r}{R_r + \frac{1}{j\omega_2 C_r} + \frac{1}{j\omega_2 C_x} // R_x} \dot{V}_{s2} \right|$$

$$\varphi_1 = -\arctan \frac{1 - \omega_1^2 C_x^2 R_x^2 + \omega_1^2 C_r C_x R_x^2}{\omega_1 R_r C_r (1 - \omega_1^2 C_x^2 R_x^2) + \omega_1 R_x C_r}$$

$$\varphi_2 = -\arctan \frac{1 - \omega_2^2 C_x^2 R_x^2 + \omega_2^2 C_r C_x R_x^2}{\omega_2 R_r C_r (1 - \omega_2^2 C_x^2 R_x^2) + \omega_2 R_x C_r}$$

wherein $|\dot{v}_{r1}|$ represents the first voltage, and $|\dot{v}_{r2}|$ represents the second voltage; $\omega_1$ represents the harmonic signal of the first frequency, and $\omega_2$ represents the harmonic signal of the second frequency; $R_r$ represents an impedance of the sampling resistor, and $C_r$ represents a capacitance value of a direct current blocking capacitor; $R_x$ represents the ground insulation impedance, and $C_x$ represents a capacitance value of a parasitic capacitor in the photovoltaic energy system; $|\dot{V}_{s1}|$ represents a maximum voltage of the harmonic signal of the first frequency, and $|\dot{V}_{s2}|$ represents a maximum voltage of the harmonic signal of the second frequency; and $\varphi_1$ represents the first phase, and $\varphi_2$ represents the second phase.

15. The photovoltaic energy system according to claim 3, wherein, the ground insulation impedance satisfies the following formula:

$$R_x = \frac{R_r(|\dot{V}_{s1}|\cos\varphi_1 - |\dot{v}_{r1}|)}{|\dot{v}_{r1}|\cos^2(\arctan(\omega_1 C_x R_x))} \text{ or }$$

$$R_x = \frac{R_r(|\dot{V}_{s2}|\cos\varphi_2 - |\dot{v}_{r2}|)}{|\dot{v}_{r2}|\cos^2(\arctan(\omega_2 C_x R_x))}$$

$C_x R_x$ satisfies the following formula:

$$C_x R_x = \frac{\omega_2 |\dot{v}_{r1}| |\dot{V}_{s2}|\sin\varphi_2 - \omega_1 |\dot{v}_{r2}| |\dot{V}_{s1}|\sin\varphi_1}{\omega_1^2 |\dot{v}_{r2}| |\dot{V}_{s1}|\cos\varphi_1 - \omega_1^2 |\dot{v}_{r2}| |\dot{v}_{r1}| - \omega_2^2 |\dot{v}_{r1}| |\dot{V}_{s2}|\cos\varphi_2 + \omega_1^2 |\dot{v}_{r1}| |\dot{v}_{r2}|}$$

wherein $|\dot{v}_{r1}|$ represents the first voltage, and $|\dot{v}_{r2}|$ represents the second voltage; $\omega_1$ represents the harmonic signal of the first frequency, and $\omega_2$ represents the harmonic signal of the second frequency; $R_r$ represents an impedance of the sampling resistor, $R_x$ represents the ground insulation impedance, and $C_x$ represents a capacitance value of a parasitic capacitor in the photovoltaic energy system; and $|\dot{V}_{s1}|$ represents a maximum voltage of the harmonic signal of the first frequency, and $|\dot{V}_{s2}|$ represents a maximum voltage of the harmonic signal of the second frequency; and $\varphi_1$ represents the first phase, and $\varphi_2$ represents the second phase.

16. A method for detecting a ground insulation impedance, applied to a photovoltaic energy system, wherein the photovoltaic energy system comprises one or more conversion circuits and a detection circuit, and the one or more conversion circuits are connected in parallel between a positive bus and a negative bus, wherein the detection circuit comprises a signal source excitation branch, a first sampling circuit, and a control circuit; wherein, one terminal of the signal source excitation branch is connected to a ground wire, and the other terminal of the signal source excitation branch is connected to the positive bus or the negative bus; the signal source excitation branch comprises an alternating current signal source and a sampling resistor that are connected in series; and the first sampling circuit is connected in parallel to the sampling resistor, and the control circuit is connected to both an input terminal of the alternating current signal source and an output terminal of the first sampling circuit, wherein, the method comprises:

controlling, by the control circuit, the alternating current signal source to output harmonic signals of a first frequency and a second frequency, wherein the first frequency is different from the second frequency;

receiving, by the control circuit, a first voltage and a second voltage that are sent by the first sampling circuit, wherein the first voltage is obtained by the first sampling circuit by collecting a voltage at both terminals of the sampling resistor when the alternating current signal source outputs the harmonic signal of the first frequency, and the second voltage is obtained by the first sampling circuit by collecting a voltage at both terminals of the sampling resistor when the alternating current signal source outputs the harmonic signal of the second frequency; and determining, by the control circuit based on the harmonic signals of the first frequency and the second frequency, the first voltage, and the second voltage, a ground insulation impedance obtained after the one or more conversion circuits are connected in parallel.

17. The method according to claim 16, wherein, the method further comprises:

receiving, by the control circuit, a first phase and a second phase that are sent by the first sampling circuit, wherein the first phase corresponds to the first voltage and is collected by the first sampling circuit when the first sampling circuit collects the first voltage, and the second phase corresponds to the second voltage and is collected by the first sampling circuit when the first sampling circuit collects the second voltage; and the determining, by the control circuit based on the harmonic signals of the first frequency and the second frequency, the first voltage, and the second voltage, a ground insulation impedance obtained after the one or more conversion circuits are connected in parallel comprises:

determining, by the control circuit based on the harmonic signals of the first frequency and the second frequency, the first voltage, the second voltage, the first phase, and the second phase, the ground insulation impedance obtained after the one or more conversion circuits are connected in parallel.

18. The method according to claim 16, wherein, the method further comprises:

when the ground insulation impedance is greater than or equal to a first impedance threshold, determining, by the control circuit, that an insulation status of the one or more conversion circuits is normal.

19. The method according to claim 18, wherein, the detection circuit further comprises a leakage current sampling circuit one-to-one connected to the one or more conversion circuits, an input terminal of each leakage current sampling circuit is connected to both an input terminal and an output terminal of a conversion circuit connected to the leakage current sampling circuit, and an output terminal of each leakage current sampling circuit is connected to the control circuit, and, the method further comprises:

receiving, by the control circuit, a total leakage current of the connected conversion circuit sent by each leakage current sampling circuit, wherein the total leakage current of the conversion circuit is obtained by each leakage current sampling circuit by sampling a first leakage current between the connected conversion circuit and the positive bus and a second leakage current between the connected conversion circuit and the negative bus; and when the ground insulation impedance is less than a second impedance threshold, determining, by the control circuit, that an insulation status of a conversion circuit corresponding to a total leakage current whose value is the largest in the total leakage currents sent by all the leakage current sampling circuits is abnormal, wherein the second impedance threshold is half of the first impedance threshold.

20. The method according to claim 19, wherein, the detection circuit further comprises a second sampling circuit and a third sampling circuit, one terminal of the second sampling circuit is connected to the positive bus and the other terminal of the second sampling circuit is connected to the ground wire, and the second sampling circuit is connected to the control circuit and is configured to: sample a voltage between the positive bus and the ground wire to obtain a first bus voltage, and send the first bus voltage to the control circuit, one terminal of the third sampling circuit is connected to the negative bus and the other terminal of the third sampling circuit is connected to the ground wire, and the third sampling circuit is connected to the control circuit and is configured to: sample a voltage between the negative bus and the ground wire to obtain a second bus voltage, and send the second bus voltage to the control circuit, and, the method further comprises:

when the ground insulation impedance is less than the first impedance threshold and greater than or equal to the second impedance threshold, determining, by the control circuit based on the first bus voltage, the second bus voltage, and the ground insulation impedance, a positive ground insulation impedance obtained after the one or more conversion circuits are connected in parallel between the positive bus and the ground wire and a negative ground insulation impedance obtained after the one or more conversion circuits are connected in parallel between the negative bus and the ground wire;

when the positive ground insulation impedance is greater than or equal to the first impedance threshold, determining, by the control circuit, an insulation status of the one or more conversion circuits between the positive bus and the ground wire is normal, else, determining that an insulation status of the one or more conversion circuits between the positive bus and the ground wire is abnormal; and when the negative ground insulation impedance is greater than or equal to the first impedance threshold, determining, by the control circuit, that an insulation status of the one or more conversion circuits between the negative bus and the ground wire is normal, else, determining that an insulation status of the one or more conversion circuits between the negative bus and the ground wire is abnormal.

\* \* \* \* \*